(12) United States Patent
Hata et al.

(10) Patent No.: US 9,341,318 B2
(45) Date of Patent: May 17, 2016

(54) LIGHTING DEVICE AND LIGHT SOURCE DEVICE

(71) Applicant: Sharp Kabushiki Kaisha, Osaka-shi, Osaka (JP)

(72) Inventors: Toshio Hata, Osaka (JP); Makoto Agatani, Osaka (JP); Toyonori Uemura, Osaka (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 0 days.

(21) Appl. No.: 14/579,001

(22) Filed: Dec. 22, 2014

(65) Prior Publication Data

US 2015/0138775 A1    May 21, 2015

Related U.S. Application Data

(63) Continuation of application No. 14/006,131, filed as application No. PCT/JP2012/055121 on Feb. 29, 2012, now Pat. No. 8,967,829.

(30) Foreign Application Priority Data

Mar. 25, 2011 (JP) ................................ 2011-068973

(51) Int. Cl.
| | | |
|---|---|---|
| *F21V 9/16* | (2006.01) | |
| *F21K 99/00* | (2016.01) | |
| *F21V 19/00* | (2006.01) | |
| *F21V 3/04* | (2006.01) | |
| *H01L 25/075* | (2006.01) | |
| *H01L 33/60* | (2010.01) | |
| *F21Y 101/02* | (2006.01) | |
| *F21Y 111/00* | (2016.01) | |
| *H01L 23/00* | (2006.01) | |
| *F21V 17/00* | (2006.01) | |
| *F21V 23/04* | (2006.01) | |

(52) U.S. Cl.
CPC ............... *F21K 9/1355* (2013.01); *F21K 9/135* (2013.01); *F21K 9/50* (2013.01); *F21K 9/56* (2013.01); *F21K 9/90* (2013.01); *F21V 3/0418* (2013.01); *F21V 3/0436* (2013.01); *F21V 19/002* (2013.01); *F21V 17/002* (2013.01); *F21V 23/0471* (2013.01); *F21Y 2101/02* (2013.01); *F21Y 2111/001* (2013.01); *F21Y 2111/008* (2013.01); *H01L 24/45* (2013.01); *H01L 25/0753* (2013.01); *H01L 33/60* (2013.01); *H01L 2224/45144* (2013.01); *H01L 2224/48091* (2013.01); *H01L 2224/48465* (2013.01); *H01L 2924/12035* (2013.01); *H01L 2924/12041* (2013.01); *H01L 2924/3025* (2013.01)

(58) Field of Classification Search
CPC ....... H01L 33/36; H01L 33/504; H01L 24/45; H01L 25/0753; H01L 33/60; H01L 2224/45144; H01L 2224/48091; H01L 2224/48465; H01L 2924/12035; H01L 2924/12041; H01L 2924/3025; F21K 9/135; F21Y 2101/02; F21Y 2105/001; F21Y 2111/001; F21Y 2111/008; Y10T 428/268; F21V 23/0471
USPC ........................................ 362/249.02; 313/46
See application file for complete search history.

(56) References Cited

U.S. PATENT DOCUMENTS

| | | | | |
|---|---|---|---|---|
| 7,843,131 B2 * | 11/2010 | Konishi | .................... | F21K 9/00 313/505 |
| 8,227,964 B2 | 7/2012 | Choi et al. | | |
| 8,427,048 B2 * | 4/2013 | Konishi | .................... | F21K 9/00 313/505 |
| 2003/0031015 A1 | 2/2003 | Ishibashi | ....................... | 362/249 |
| 2006/0181416 A1 | 8/2006 | Chen | | |
| 2009/0166657 A1 | 7/2009 | Yamada et al. | .................. | 257/98 |
| 2010/0097811 A1 * | 4/2010 | Betsuda | .................. | F21K 9/135 362/362 |
| 2012/0033423 A1 * | 2/2012 | Kim | ...................... | F21K 9/1355 362/235 |
| 2012/0127736 A1 | 5/2012 | Hoetzl et al. | | |
| 2013/0314912 A1 | 11/2013 | Chang | | |

FOREIGN PATENT DOCUMENTS

| | | |
|---|---|---|
| CN | 101097052 A | 1/2008 |
| EP | 1 298 382 A1 | 4/2003 |
| JP | 2003-59305 | 2/2003 |
| JP | 2006-113752 | 4/2006 |
| JP | 2007-317431 | 12/2007 |
| JP | 2008-98544 | 4/2008 |
| JP | 2009-21082 | 1/2009 |
| JP | 2009-140778 | 6/2009 |
| JP | 2009-164157 | 7/2009 |
| JP | 2010-62005 | 3/2010 |

(Continued)

OTHER PUBLICATIONS

International Search Report for PCT/JP2012/055121, mailed Apr. 24, 2012.

(Continued)

*Primary Examiner* — Tracie Y Green
(74) *Attorney, Agent, or Firm* — Nixon & Vanderhye, P.C.

(57) ABSTRACT

An LED bulb (100) including a light source device (105) provided on a mounting plate (102) and covered by a globe (104) in a shape of a spherical shell is configured such that the light source device (105) includes: a reflecting member (108) in a truncated cone shape; and a plurality of LED chips (15) provided on a top surface of the substrate (11), at least a side face of the reflecting member (108) has a light reflecting function, and the light source device (105) is provided on the mounting plate (102) in such a way that a bottom surface of the substrate (11) faces the mounting plate (102).

14 Claims, 15 Drawing Sheets

(56) References Cited

FOREIGN PATENT DOCUMENTS

| JP | 2010-86946 | 4/2010 |
|----|------------|--------|
| JP | 2010-157459 | 7/2010 |
| JP | 2010-205553 | 9/2010 |
| JP | 2010-282754 | 12/2010 |
| WO | 2011/012437 A1 | 2/2011 |

OTHER PUBLICATIONS

Written Opinion for PCT/JP2012/055121, mailed Apr. 24, 2012.

* cited by examiner

LIGHTING DEVICE AND LIGHT SOURCE DEVICE

This application is a continuation of U.S. patent application Ser. No. 14/006,131 filed Sep. 19, 2013, which is the U.S. national phase of International Application No. PCT/JP2012/055121 filed 29 Feb. 2012 which designated the U.S. and claims priority to JP Patent Application No. 2011-068973 filed 25 Mar. 2011, the entire contents of each of which are hereby incorporated by reference.

TECHNICAL FIELD

The present invention relates to an illumination device, for example, an LED (light emitting diode) bulb, which includes a light source device in which an LED is employed. In particular, the present invention relates to a technique which enhances light distribution characteristics.

BACKGROUND ART

In recent years, from a viewpoint of energy saving, an illumination device (for example, an LED bulb) including a light source in which an LED is employed has been used. However, the light source employing an LED has a problem of a small light distribution angle due to its structure or a directivity of emitted light. In view of this, various illumination devices having configurations for improving its light distribution characteristics have been proposed.

For example, Patent Literature 1 describes an ultra-wide light distribution LED lamp which is capable of improving its light distribution characteristics. FIG. 20 is a cross sectional view showing a configuration of an ultra-wide light distribution LED lamp 2000 described in Patent Literature 1. The ultra-wide light distribution LED lamp 2000 includes a substrate 2001 in which metal frames 2002 and 2003 are insert-molded, an LED chip 2004 provided on the substrate 2001, and a light transmissive plastic cover 2005 which shields the LED chip 2004.

The LED chip 2004 is provided on a top flat surface 2007 of a projection part 2006 which is formed at a part of the metal frame 2002. The top flat surface 2007 is configured to be higher than a surface of the substrate 2001. In the ultra-wide light distribution LED lump 2000, a light distribution angle is widened by providing the LED chip 2004 at a highest position, whereby light distribution characteristics are enhanced.

Furthermore, Patent Literature 2 describes a bulb illumination device from which luminous intensity can be obtained in a desired direction on a basis of a situation. FIG. 21 is a cross sectional view showing a configuration of a bulb illumination device 2100 described in Patent Literature 2. The bulb illumination device 2100 includes (i) a main body provided with an electronic supply base 2101 at its one end and a block shaped protrusion part 2102 protruding in a direction of a rotation axis of the electronic supply base 2101 at the other end, (ii) a plurality of light-emitting modules 2103 provided on various points on an outer surface of the protrusion part 2102, (iii) a circuit section 2104 which selectively turns on the plurality of light-emitting modules 2103, and (iv) a globe 2105 which covers the plurality of light-emitting modules 2103.

In the bulb illumination device 2100, the plurality of light-emitting modules 2103 provided on various points on the outer surface of the protrusion part 2102 are selectively turned on by the circuit section 2104. This makes it possible to switch over a plurality of light distribution patterns each having a luminous intensity peak in a different direction. With this configuration, light distribution characteristics are improved.

CITATION LIST

Patent Literatures

Patent Literature 1
Japanese Patent Application Publication, Tokukai, No. 2008-98544 A (Publication Date: Apr. 24, 2008)
Patent Literature 2
Japanese Patent Application Publication, Tokukai, No. 2010-282754 A (Publication Date: Dec. 16, 2010)

SUMMARY OF INVENTION

Technical Problem

In conventional illumination devices as described above, a luminous intensity in a globe direction can be sufficient, but an enough luminous intensity in a base-side direction cannot be obtained. Accordingly, it is not possible for the conventional illumination devices to obtain light distribution characteristics equivalent to those of conventional incandescent lamps. Therefore, the conventional illumination devices still have a problem of poor light distribution characteristics.

The ultra-wide light distribution LED lamp 2000 described in FIG. 20 has complex configurations of the metal frames 2002 and 2003. Furthermore, the metal frames 2002 and 2003 (i) are where the LED chip 2004 is mounted and also (ii) serve as wiring. This restricts the projection part 2006 in terms of its shape. Furthermore, the metal frames 2002 and 2003 become light-blocking sections since the metal frames 2002 and 2003 project outside the plastic cover 2005. Therefore, it is not possible to sufficiently widen the light distribution angle in a substrate direction.

Furthermore, in the bulb illumination device 2100 described in FIG. 21, no luminous intensity can be obtained in the base-side direction due to where the plurality of light-emitting modules 2103 are provided on the protrusion part 2102 and because a heat sink 2106 become a light-blocking section. Furthermore, in a case where the plurality of light-emitting modules 2103 are provided, for example, on a side face of the protrusion part 2102, producing such an illumination device will be complicated, thereby making it difficult to mass-produce the bulb illumination device 2100.

As a result, the conventional illumination devices have such disadvantages that an area right under the illumination device is bright but an area behind the illumination device is dark. Therefore, it has been desired to realize, in a simple configuration, a light source employing an LED, which has light distribution characteristics equivalent to those of the conventional incandescent lamp by solving the disadvantages of the LEDs regarding its light emission restricted due to the structure or the directivity of the LEDs.

The present invention has been made in view of the above conventional problems, and an object of the present invention is to provide, in a simple configuration, an illumination device and a light source device each of which has excellent light distribution characteristics.

Solution to Problem

In order to solve the above problems, an illumination device of the present invention includes: a light source device provided on a mounting base and covered by a globe in a shape of a spherical shell, wherein the light source includes: a first substrate having a first surface and a second surface on an opposite side of the first surface; at a center of the first surface, a first reflecting member in a truncated cone shape, which first reflecting member is provided in such a way that a side face of the first reflecting member makes an exterior acute angle with the first surface; and a plurality of first light-emitting elements provided, on the first surface, so as to surround the first reflecting member, at least the side face of the first reflecting member has a light reflecting function, and the light source device is provided on the mounting base in such a way that the second surface of the first substrate faces the mounting base.

According to the above configuration, light emitted from light-emitting elements can be reflected in a direction of 90° or more with respect to a perpendicular line by the first reflecting member provided on the surface on which the light-emitting elements are provided, assuming that the perpendicular line perpendicular to the first surface of the first substrate from a globe side is 0°. As a result, a luminous intensity on a mounting base side can be attained without the need of a complex structure.

Accordingly, a total light distribution angle of the illumination device of the present invention becomes greater compared with that of the conventional illumination device by summing up emission light from the illumination device of the present invention. Therefore, it is possible to provide, in a simple configuration, an illumination device having excellent light distribution characteristics.

An illumination device of the present invention includes a light source device provided on a mounting surface and covered by a globe in a shape of a spherical shell, wherein the light source device includes: a plurality of substrates each being provided with a plurality of light-emitting elements, the plurality of substrates being stacked in a perpendicular direction to the mounting surface; and a first reflecting member being sandwiched between each substrates thus stacked, the first reflecting member being in a truncated cone shape, and at least a side face of the first reflecting member having a light reflecting function, each first reflecting member being provided on each of the plurality of substrates except a topmost substrate among the plurality of substrates, in such a way that the first reflecting member is positioned at a center of that substrate, the side face of the first reflecting member makes an acute exterior angle with that substrate, and the plurality of light-emitting elements on that substrate are provided so as to surround the first reflecting member.

According to the above configuration, light emitted from light-emitting elements on each of the plurality of substrates except a topmost substrate among the plurality of substrates can be reflected in a direction of 90° or more with respect to a perpendicular line by the first reflecting member provided on the surface on which the light-emitting elements are provided, assuming that the perpendicular line perpendicular to the mounting surface from the globe side is 0°. As a result, a luminous intensity on a mounting surface side can be attained without the need of a complex structure.

Accordingly, the total light distribution angle of the illumination device of the present invention is greater compared with that of the conventional illumination device by summing up emission light from the illumination device of the present invention. Therefore, it is possible to provide, in a simple configuration, an illumination device having excellent light distribution characteristics.

A light source device of the present invention is a light source device for emitting light from light-emitting elements as light sources, the light source device including: a substrate on which the plurality of light-emitting elements are provided; and a reflecting member in a truncated cone shape, at least a side face of the reflecting member having a light reflecting function, the reflecting member being provided on the substrate in such a way that the reflecting member is positioned at a center of the substrate, the side face of the reflecting member makes an acute exterior angle with the substrate, and the plurality of light-emitting elements on that substrate are provided so as to surround the reflecting member.

According to the above configuration, light emitted from light-emitting elements can be reflected in a direction of 90° or more with respect to a perpendicular line by the reflecting member provided on the surface on which the light-emitting elements are provided, assuming that the perpendicular line perpendicular to the substrate from the surface on which the light-emitting elements are provided is 0°. As a result, a luminous intensity on a rear side of the substrate, on a top surface of which the light-emitting elements are provided can be attained without the need of a complex structure. Therefore, it is possible to contribute to improvement of the light distribution characteristics.

A light source device of the present invention is a light source device for emitting light from light-emitting elements as light sources, the light source device including: a plurality of substrates each being provided with the plurality of light-emitting elements, the plurality of substrates being stacked; and a first reflecting member being sandwiched between each substrates thus stacked, the first reflecting member being in a truncated cone shape, and at least a side face of the first reflecting member having a light reflecting function, each first reflecting member being provided on each of the plurality of substrates except a topmost substrate among the plurality of substrates, in such a way that the first reflecting member is positioned at a center of that substrate, the side face of the first reflecting member makes an acute exterior angle with that substrate, and the plurality of light-emitting elements on that substrate are provided so as to surround the first reflecting member.

According to the above configuration, light emitted from light-emitting elements on each of the plurality of substrates except a topmost substrate among the plurality of substrates can be reflected in a direction of 90° or more with respect to a perpendicular line by the first reflecting member provided on the surface on which the light-emitting elements are provided, assuming that the perpendicular line perpendicular to the substrate from the surface on which the light-emitting elements are provided is 0°. As a result, a luminous intensity on a rear side of the substrate, on a top surface of which the light-emitting elements are provided can be attained without the need of a complex structure. Therefore, it is possible to contribute to improvement of the light distribution characteristics.

Advantageous Effects of Invention

As described above, an illumination device of the present invention is configured to include a light source device which reflects light emitted from a light-emitting element(s) in a direction of a mounting base side by a reflecting member provided on a same surface as the light-emitting element(s) is(are) provided. Therefore, it is possible to provide, in a simple configuration, an illumination device having excellent light distribution characteristics.

DESCRIPTION OF EMBODIMENTS

Figure 1:
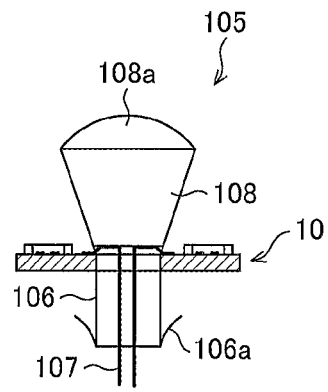
FIG. 1 is a cross sectional view showing a configuration of a light source device included in an LED bulb illustrated in FIG. 2.

The present invention relates to an LED illumination device that employs an LED as a light source. One specific example of such an LED illumination device is, for instance, an LED bulb. Each embodiment of the present invention discusses, with reference to drawings, the LED bulb.

An LED bulb in general is configured to include a housing in an inverted truncated cone shape, and is configured such that, on a lower surface side of the housing, a base is provided, and on an upper surface side of the housing, a light source, and a globe for covering the light source are provided. In the following description, for the sake of easy explanation, the term "upper side" (upward direction) is used to mean a side on which the globe is provided with respect to the housing in a rotational axis of the base, and the term "lower side" (downward direction) is used to mean a side on which the base is provided with respect to the housing in a rotational axis of the base. It is needless to say that the terms "upward and downward directions" in this description do not give any limitation to directions in which the globe and the base are actually provided.

Note also that, the terms "truncated cone", "inverted truncated cone", "central", "concentric", "circular", "circular ring", "hemispherical", "spherical shell", and "at regular interval" not only refer to their exact shapes and definitions as expressed, but also encompass scopes each of which is regarded to be substantially equal to truncated cone, inverted truncated cone, central, concentric, circular, circular ring, hemispherical, spherical shell, and at regular interval (i.e., substantially truncated cone, substantially inverted truncated cone, substantially central, substantially concentric, substantially circular, substantially circular ring, substantially hemispherical, substantially spherical shell, and at substantially regular interval).

Furthermore, each embodiment is identical with their preceding embodiment(s) in terms of configurations not described in that embodiment. Therefore, for the sake of easy explanation, each embodiment is described in such a way that members having the like functions as those illustrated in the drawing(s) of the preceding embodiment(s) are labeled with the like reference numbers and explanations of such members are omitted in that embodiment.

[Embodiment 1]

One embodiment of the present invention is described below with reference to drawings.

(1-1: Configuration of LED Bulb)

Figure 2:
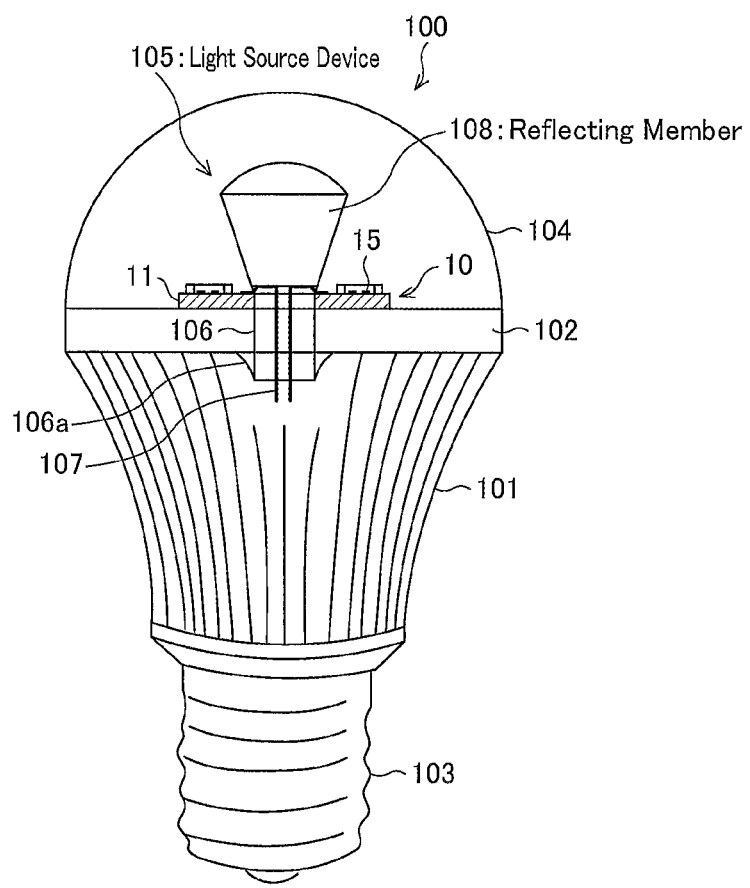
FIG. 2 is a view schematically showing an LED bulb in accordance with Embodiment 1 of the present invention.

FIG. 2 is a view schematically showing one example of a configuration of an LED bulb 100 of the present embodiment. As shown in FIG. 2, the LED bulb 100 includes a housing 101, a mounting plate 102 (mounting base), a base 103, a globe 104, and a light source device 105.

The housing 101 is in an inverted truncated cone shape. The housing 101 has the mounting plate 102 fixed on its upper surface side, and the base 103 fixed on its lower surface side. The housing 101 contains, in its inside, a circuit substrate (not shown) on which a drive circuit is formed.

The mounting plate 102 is formed in a circular shape in a planar view. The light source device 105 and the globe 104 are provided on one surface (mounting surface) of the mounting plate 102. A through hole is provided at the center of the mounting plate 102. The base 103 is, for example, type E (Edison Screw type). To use the LED bulb 100, the base 103 is screwed into a socket.

The globe 104 is a cover made of a resin, and is formed in a hemispherical shape. The globe 104 is fixed to the mounting plate 102 so as to cover the light source device 105 and a mounting surface of the mounting plate 102. The globe 104 is preferably made of, for example, glass, an acrylic or a polycarbonate material in milky white color. The size of the globe 104 is, for example, 60 mm in diameter (outer diameter) and 2.5 mm in thickness.

The light source device 105 is a light-emitting device in which an LED is employed as a light source. The light source device 105 has a pipe 106 having a function like that of a rivet for installation (fixation). At one end of the pipe 106, a hook 106a having a hooking part is formed. The light source device 105 is fixed to the mounting plate 102 by causing the hook 106a to be hooked by the mounting plate 102 when the pipe 106 is inserted into the through hole of the mounting plate

102. This allows the light source device 105 to be provided at the center of the mounting plate 102.

Furthermore, the light source device 105 has two lead wires 107, one of which is for a cathode and the other of which is for an anode. The lead wires 107 are provided inside the pipe 106. In the pipe 106, the lead wires 107 are guided into the housing 101 via the through hole of the mounting plate 102, thereby being electrically connected to the drive circuit contained in the housing 101.

(1-2: Configuration of Light Source)

Next, a configuration of the light source device 105 is described.

FIG. 1 is a cross sectional view showing one exemplary configuration of the light source device 105. As shown in FIG. 1, the light source device 105 is constituted by a sub-light source 10 and a reflecting member 108 (first reflecting member). The following description first discusses the sub-light source 10 in detail, and then the reflecting member 108.

(1-2-1: Sub-Light Source)

Figure 3:
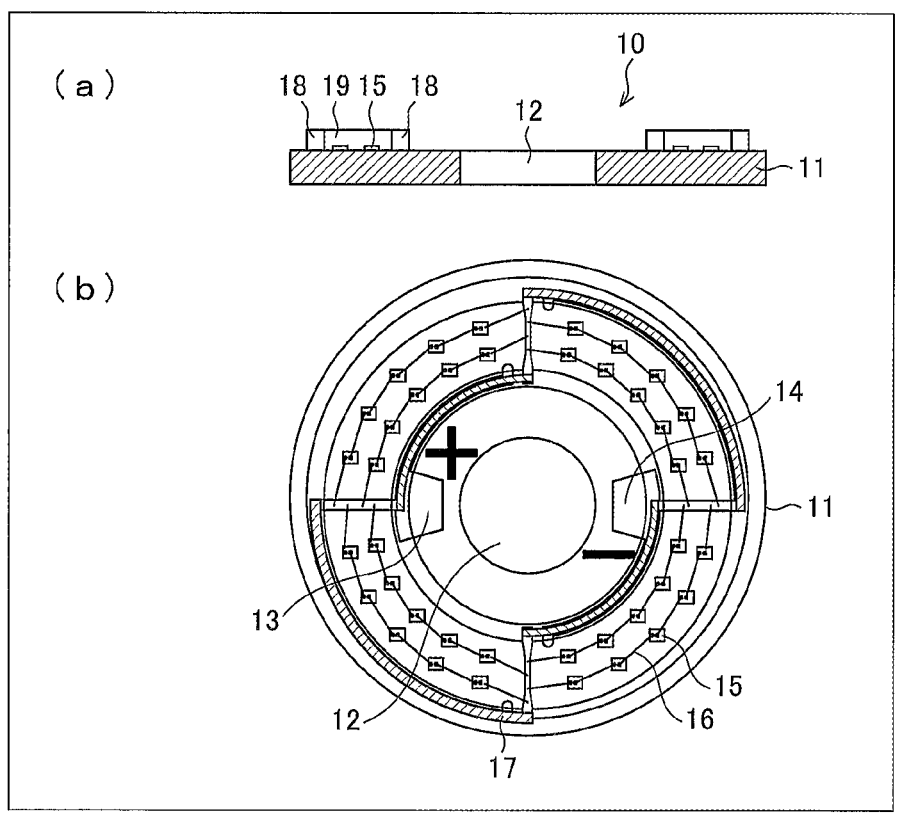
FIG. 3 is a view showing one exemplary configuration of a sub-light source. (a) of FIG. 3 illustrates a cross sectional structure seen from a side, and (b) of FIG. 3 illustrates the configuration viewed from its top.

FIG. 3 is a view showing one exemplary configuration of the sub-light source 10. (a) of FIG. 3 illustrates a cross sectional structure seen from a side, and (b) of FIG. 3 illustrates the configuration viewed from its top. As shown in FIG. 3, the sub-light source 10 includes a substrate 11 (first substrate), LED chips 15 (light-emitting elements, first light-emitting elements), printed resistors 17, resin dams 18, and a sealing resin 19.

The substrate 11 is a ceramic substrate on which a wiring pattern is formed. The substrate 11 is formed in a circular shape in a planar view, and at its center, a through hole 12 is provided. That is, the substrate 11 is formed in a circular ring (ring) shape. The through hole 12 is provided in order to cause the pipe 106 of the reflecting member 108 and the lead wires 107 to pass the through hole 12.

The wiring pattern is formed on one surface (hereinafter referred to as a top surface) of the substrate 11 (first surface). The wiring pattern includes, for example, an anode land 13 and a cathode land 14 each of which is capable of being connected to outside. The anode land 13 and the cathode land 14 are provided across the through hole 12. The size of the substrate 11 is, for example mm in diameter (outer diameter), and 1 mm in thickness. The diameter of the through hole 12 is 8 mm.

The LED chips 15 are, but not limited to, blue LEDs. The LED chips 15 are directly provided on the top surface of the substrate 11. The plurality of LED chips 15 are provided (40 LED chips are provided in the present embodiment), and arranged in two circular lines (each line has 20 LED chips) concentrically with the substrate 11. The LED chips 15 are arranged at regular intervals herein, but may not be arranged at regular intervals. The plurality of LED chips 15 are electrically connected between the anode land 13 and the cathode land 14 in a 10-in-series and 4-in-parallel configuration (in which each 10 LED chips 15 are connected in series and each 4 such connected lines are connected in parallel). The LED chips 15 are directly connected to each other via a gold wire 16 in a wire bonding method. Furthermore, the LED chips 15 and the wiring pattern are also connected to each other via a gold wire 16 in the wire bonding method.

The printed resistors 17 are wirings to deal with a surge that occurs in the LED chips 15. The printed resistors 17 are formed, on the top surface of the substrate 11, respectively at four places so as to be parallel connected with the LED chips 15. Note that the printed resistors 17 can be substituted by a protecting element such as Zener diode.

The resin dams 18 are resins to retain the sealing resin 19. Each of the resin dams 18 is formed in a circular ring shape on the top surface of the substrate 11, and provided respectively on an inner side and an outer side of a region in which the LED chips 15 are provided. The resin dams 18 are made of a colored (preferably in white or milky white color) insulating resin material such as a white silicon resin (containing $TiO_2$ filler). The resin dams 18 are formed in such a manner that the material for the resin dams 18 in a liquid state is poured on the substrate 11 and subjected to thermosetting by heating the material in 150° C. for 60 minutes. The size of the outer one of the resin dams 18 is, for example, 1 mm in width and 25 mm in diameter, and the inner one of the resin dams 18 is 1 mm in width and 15 mm in diameter, for example.

The sealing resin 19 is a resin layer for sealing the LED chips 15. The sealing resin 19 is provided on the top surface of the substrate 11 so as to fill a part surrounded by the resin dams 18. Accordingly, the sealing resin 19 is provided in a circular ring shape. The sealing resin 19 is made of an insulating resin material containing a fluorescent material such as a fluorescent material-containing silicon resin. The sealing resin 19 is formed in such a manner that a material for the sealing resin 19 in a liquid state in which the fluorescent material is scattered is poured into the part surrounded by the resin dams 18 and subjected to thermosetting by heating the material in 150° C. for 5 hours.

The fluorescent material can be selected so as to convert light emitted by the LED chips 15 into light having a desired color. For example, in a case where the LED bulb 100 having blue LED chips 15 is caused to emit white light, two types of fluorescent materials, green fluorescent materials (for example $Ca_3 (Sr.Mg)_2Si_3O_{12}:Ce$) and red fluorescent materials (for example $(Sr.Ca)AlSiN_3:Eu$) can be used. In this way, it is possible to easily obtain, from the LED bulb 100, emission light having a desired color by (i) sealing the LED chips 15 with the sealing resin 19 containing fluorescent materials and (ii) selecting the fluorescent materials in consideration of a combination of the fluorescent materials and a color of light emitted by the LED chips 15.

(1-2-2: Reflecting Member)

As shown in FIG. 1, the reflecting member 108 is in an inverted truncated cone shape. At the center of the sub-light source 10, the reflecting member 108 is provided so that its upper surface is located in an upward direction and its lower surface is located in a downward direction. In other words, the reflecting member 108 is in a truncated cone shape, and is provided so that a side face of the reflecting member 108 makes an acute exterior angle with the top surface of the substrate 11 of the sub-light source 10. An outer surface (at least the side face) of the reflecting member 108 has a light reflecting function.

The upper surface (top surface) of the reflecting member 108 has a lens section 108a which protrudes outwardly. The reflecting member 108 and the lens section 108a are preferably made of, for example, an acrylic or a polycarbonate material in white or milky white color. The pipe 106 and the lead wires 107 are provided at the lower surface (bottom surface) of the reflecting member 108. Note that the reflecting member 108 can be provided with a wiring pattern. The size of the reflecting member 108 is, for example, 14 mm in height (length) of a main part, 17 mm in outer diameter of the upper surface, and 8 mm in outer diameter of the lower surface. The lens section 108a is 5 mm in height. The pipe 106 is 6.5 mm in height (length) and 8 mm in outer diameter.

(1-2-3: Assembling of Sub-Light Source and Reflecting Member)

After preparing the sub-light source 10 and the reflecting member 108, the pipe 106 is inserted into the through hole 12 of the substrate 11 from its one end. The pipe 106 is inserted into the through hole 12 as deep as possible so that, at the center of the substrate 11, the reflecting member 108 is located on the top surface (first surface) of the substrate 11 and the pipe 106 and the lead wires 107 are located on the bottom surface (second surface) of the substrate 11. The through hole 12 is identical with the outer diameter of the pipe 106 in diameter (with some fitting allowance) and thus the reflecting member 108 is fixed to the substrate 11.

Next, on the top surface of the substrate 11, the lead wires 107 are respectively connected to the anode land 13 and the cathode land 14 by means of, for example, soldering. The lead wires 107 can be prepared with an extra length for facilitating the connection and cut off unnecessary length after the connection.

In this way, the light source device 105 including the sub-light source 10 and the reflecting member 108 fixed by the sub-light source 10 is produced. The light source device 105 is configured such that the LED chips 15 emit light when a voltage is applied thereon via the lead wires 107.

(1-3: How to Produce LED Bulb)

Next, the following description discusses how to produce the LED bulb 100.

First, the mounting plate 102 having a through hole is prepared. The mounting plate 102 is, at this stage, a single unit before being fixed to the housing 101. The pipe 106 of the light source device 105 is inserted into the through hole of the mounting plate 102 as deep as possible so that the hook 106a provided at the one end of the pipe 106 is hooked by a surface opposite to the mounting surface (back surface) of the mounting plate 102, and thus the light source device 105 is securely fixed to the mounting plate 102. Accordingly, at the center of the mounting plate 102, the sub-light source 10 and the reflecting member 108 are located on the mounting surface of the mounting plate 102, and the lead wires 107 are guided out at the back surface of the mounting plate 102.

Subsequently, the lead wires 107 are connected to the drive circuit on the back surface of the mounting plate 102. After the connection is completed, the mounting plate 102 is fixed to the housing 101 with use of, for example, a screw(s) (the mounting plate 102 serves as a cover of the housing 101). Note that the base 103 is fixed to the housing 101 in advance.

Finally, the globe 104 is fixed to the mounting plate 102 so as to cover the light source device 105 (the sub-light source 10 and the reflecting member 108) arranged on the mounting plate 102. This completes production of the LED bulb 100. The size of an external form of the LED bulb 100 is, for example, 60 mm in outer diameter and 110 mm in length.

(1-4: Summary)

As described above, the LED blub 100 includes the light source device 105, the light source device 105 includes (i) the substrate 11, (ii) at the center of the top surface of the substrate 11, the reflecting member 108 in a truncated cone shape which is provided so that a side face of the reflecting member 108 makes an acute exterior angle with the top surface of the substrate 11, and (iii) the plurality of LED chips 15 provided on the top surface of the substrate 11 so as to surround the reflecting member 108. The reflecting member 108 has, on its outer surface, a light reflecting function and the light source device 105 is provided on the mounting plate 102 so that the bottom surface of the substrate 11 faces the mounting plate 102.

According to the above configuration, light emitted from the LED chips 15 can be reflected in a direction of 90° or more with respect to a perpendicular line by the reflecting member 108 provided on the surface on which the LED chips 15 are provided, assuming that the perpendicular line perpendicular to the top surface of the substrate 11 from a globe 104 side is 0°. As a result, a luminous intensity on a mounting plate 102 side can be attained without the need of a complex structure.

Accordingly, the total light distribution angle of the LED bulb 100 is greater compared with that of a conventional LED bulb by summing up emission light from the LED bulb 100 of the present invention. Therefore, it is possible to provide, in a simple configuration, the LED bulb 100 having excellent light distribution characteristics.

Furthermore, the LED bulb 100 is configured such that the plurality of LED chips 15 are circularly positioned, at regular intervals, so as to surround the reflecting member 108. This makes it possible to obtain uniform emission light. Note that, if the uniform emission light is obtainable, the LED chips 15 are not limited to be circularly positioned at regular intervals.

Furthermore, in the LED bulb 100, the top surface of the reflecting member 108 has the lens section 108a which protrudes outwardly. With this configuration, a part of light reflected at an inner side of the globe 104 is reflected again by the lens section 108a towards a globe 104 side. Therefore, the reflecting member 108 can increase a light component towards the globe 104 side.

[Embodiment 2]

(2-1: Configuration of LED Bulb)

Figure 5:
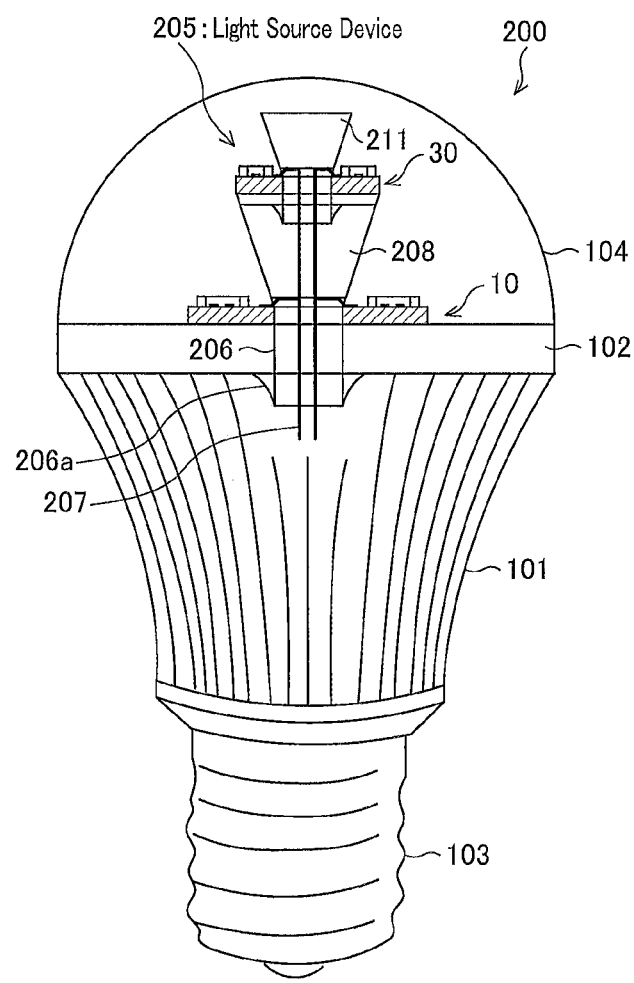
FIG. 5 is a view schematically showing the LED bulb in accordance with Embodiment 2 of the present invention.

FIG. 5 is a view schematically showing one exemplary configuration of an LED bulb 200 in accordance with the present embodiment. As shown in FIG. 5, the LED bulb 200 includes a housing 101, a mounting plate 102, a base 103, a globe 104, and a light source device 205. That is, the LED bulb 200 is configured to include, compared with the LED bulb 100 of Embodiment 1, the light source device 205 instead of the light source device 105.

The light source device 205 is a light-emitting device in which an LED is employed as a light source. The light source device 205 has a pipe 206 having a function like that of a rivet for installation. At one end of the pipe 206, a hook 206a having a hooking part is formed. The light source device 205 is fixed to the mounting plate 102 by causing the hook 206a to be hooked by the mounting plate 102 when the pipe 206 is inserted into a through hole of the mounting plate 102. This allows the light source device 205 to be provided at the center of the mounting plate 102.

Furthermore, the light source device 205 has two lead wires 207, one of which is for a cathode and the other of which is for an anode. The lead wires 207 are provided inside the pipe 206. In the pipe 206, the lead wires 207 are guided into the housing 101 via the through hole of the mounting plate 102, thereby being electrically connected to the drive circuit contained in the housing 101.

(2-2: Configuration of Light Source)

Next, a configuration of the light source device 205 is described.

Figure 4:
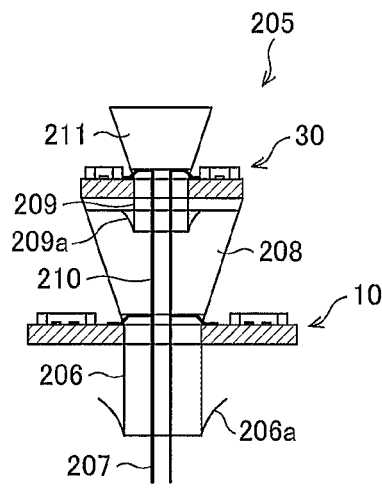
FIG. 4 is a cross sectional view showing a configuration of a light source device included in an LED bulb illustrated in FIG. 5.

FIG. 4 is a cross sectional view showing one exemplary configuration of the light source device 205. As shown in FIG. 4, the light source device 205 is constituted by a sub-light source 10 and a first reflecting member 208, a sub-light source 30, and a second reflecting member 211. The following description first discusses the sub-light source 30 in detail, and then, the first reflecting member 208 and the second reflecting member 211 in this order.

(2-2-1: Sub-Light Source)

Figure 6:
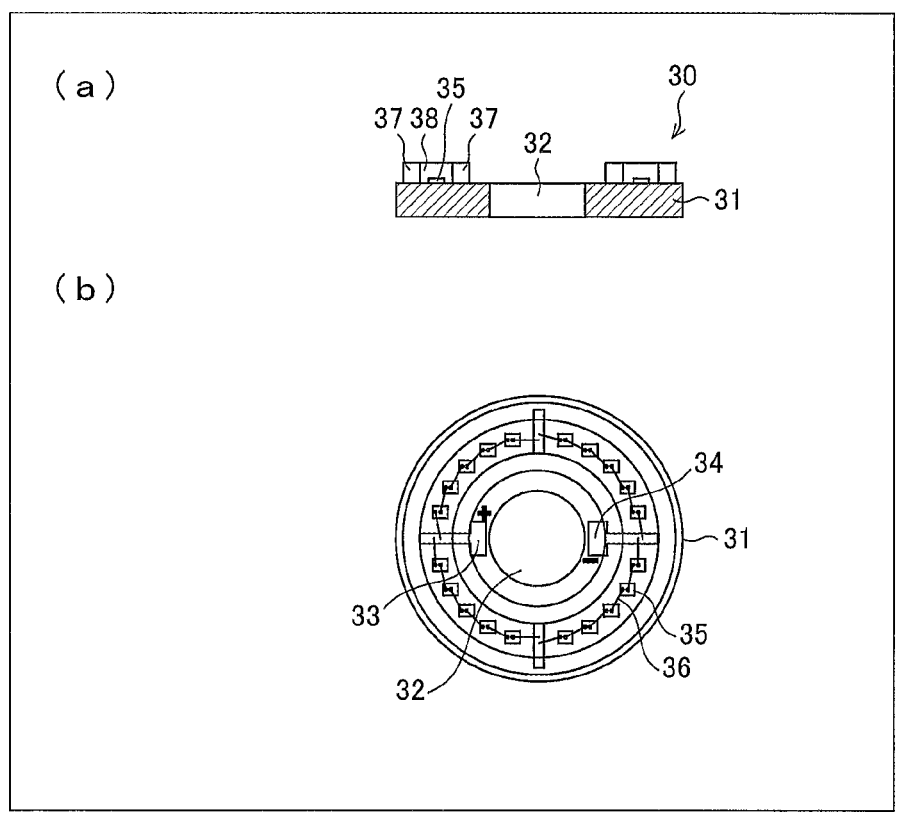
FIG. 6 is a view showing another exemplary configuration of a sub-light source. (a) of FIG. 6 illustrates a cross sectional structure seen from a side, and (b) of FIG. 6 illustrates the configuration viewed from its top.

FIG. 6 is a view showing one exemplary configuration of the sub-light source 30. (a) of FIG. 6 illustrates a cross sectional structure seen from a side, and (b) of FIG. 6 illustrates the configuration viewed from its top. As shown in FIG. 6, the sub-light source 30 includes a substrate 31 (second substrate), LED chips 35 (light-emitting elements, second light-emitting elements), resin dams 37, and sealing resin 38.

The substrate 31 is a ceramic substrate on which a wiring pattern is formed. The substrate 31 is formed in a circular shape in a planar view, and at its center, a through hole 32 is provided. That is, the substrate 31 is formed in a circular ring (ring) shape. The through hole 32 is provided in order to cause a pipe 209 of the second reflecting member 211 and lead wires 210 to pass the through hole 32. Note that a diameter of the substrate 31 is preferably made smaller than that of a substrate 11 so as to reduce, as much as possible, blocking of the light emitted by the sub-light source 10.

The wiring pattern is formed on one surface (hereinafter referred to as a top surface) of the substrate 31 (third surface). The wiring pattern includes, for example, an anode land 33 and a cathode land 34 each of which is capable of being connected to outside. The anode land 33 and the cathode land 34 are provided across the through hole 32. The size of the substrate 31 is, for example 17 mm in diameter (outer diameter), and 1 mm in thickness. The diameter of the through hole 32 is 5.5 mm.

The LED chips 35 are, but not limited to, blue LEDs. The LED chips 35 are directly provided on the substrate 31. The plurality of LED chips 35 are provided (20 LED chips are provided in the present embodiment), and arranged in one circular line concentrically with the substrate 31. The LED chips 35 are arranged at regular intervals herein, but may not be arranged at regular intervals. The plurality of LED chips 35 are electrically connected between the anode land 33 and the cathode land 34 in a 10-in-series and 2-in-parallel configuration (in which each 10 LED chips 35 are connected in series and each 2 such connected lines are connected in parallel). The LED chips 35 are directly connected to each other via a gold wire 36 in a wire bonding method. Furthermore, the LED chips 35 and the wiring pattern are also connected to each other via a gold wire 16 in the wire bonding method.

The resin dams 37 are resins to retain the sealing resin 38. Each of the resin dams 37 is formed in a circular ring shape on the top surface of the substrate 31, and provided respectively on an inner side and an outer side of a region in which the LED chips 35 are provided. The resin dams 37 are made of the material similar to that of the resin dams 18 and formed in the same manner as the resin dams 18.

The sealing resin 38 is a resin layer for sealing the LED chips 35. The sealing resin 38 is provided on the top surface of the substrate 31 so as to fill a part surrounded by the resin dams 37. Accordingly, the sealing resin 38 is provided in a circular ring shape. The sealing resin 38 is made of an insulating resin material containing a fluorescent material. The sealing resin 38 is made of the material similar to that of the sealing resin 19 and formed in the same manner as the sealing resin 19.

It is possible to easily obtain, from the LED bulb 200, emission light having a desired color by (i) sealing the LED chips 35 with the sealing resin containing the fluorescent material and (ii) selecting the fluorescent material in consideration of a combination of the fluorescent material and a color of light emitted by the LED chips 35.

(2-2-2: First Reflecting Member)

As shown in FIG. 4, the first reflecting member 208 is in an inverted truncated cone shape. At the center of the sub-light source 10, the first reflecting member 208 is provided so that its upper surface is located in an upward direction and its lower surface is located in a downward direction. In other words, the first reflecting member 208 is in a truncated cone shape, and is provided so that a side face of the first reflecting member 208 makes an acute exterior angle with the top surface of the substrate 11 of the sub-light source 10. An outer surface (at least the side face) of the first reflecting member 208 has a light reflecting function.

The upper surface (top surface) of the first reflecting member 208 is flat. The upper surface of the first reflecting member 208 is provided with the sub-light source 30. A hole is provided at the center of the upper surface of the first reflecting member 208 for fixing the second reflecting member 211. The first reflecting member 208 is preferably made of, for example, an acrylic or a polycarbonate material in white or milky white color. The pipe 206 and the lead wires 207 are provided at the lower surface (bottom surface) of the first reflecting member 208. The first reflecting member 208 is, for example, 14 mm in height (length) of a main part, 17 mm in outer diameter of the upper surface, and 8 mm in outer diameter of the lower surface. The pipe 206 is 6.5 mm in height (length) and 8 mm in outer diameter.

(2-2-3: Second Reflecting Member)

As shown in FIG. 4, the second reflecting member 211 is in an inverted truncated cone shape. At the center of the sub-light source 30, the second reflecting member 211 is provided so that its upper surface is located in an upward direction and its lower surface is located in a downward direction. In other words, the second reflecting member 211 is in a truncated cone shape, and provided so that a side face of the second reflecting member 211 makes an acute exterior angle with the top surface of the substrate 31 of the sub-light source 30. An outer surface (at least the side face) of the second reflecting member 211 has a light reflecting function. The size of an external form of the second reflecting member 211 is smaller than that of the first reflecting member 208.

The upper surface (top surface) of the second reflecting member 211 is flat. The second reflecting member 211 is preferably made of, for example, an acrylic or a polycarbonate material in white or milky white color. The lower surface (bottom surface) of the second reflecting member 211 has the pipe 209 and the lead wires 210. The pipe 209 has a function like that of a rivet for installation. At one end of the pipe 209, a hook 209a having a hooking part is formed. The lead wires 210, one of which is for a cathode and the other of which is for an anode, are provided inside the pipe 209. The size of the second reflecting member 211 is, for example, 7 mm in height (length) of a main part, 11 mm in outer diameter of the upper surface, and 5.5 mm in outer diameter of the lower surface. The pipe 209 is 5 mm in height (length) and 5.5 mm in outer diameter.

Note that, the upper surface of the second reflecting member 211 is configured to be flat, however, the upper surface can be formed in a shape of a lens that protrudes outwardly.

(2-2-4: Assembling of Sub-light Source and Reflecting Member)

After individually preparing the first reflecting member 208, the sub-light source 30, and the second reflecting member 211, the sub-light source is placed on the upper surface of the first reflecting member 208 so that a position of the through hole 32 of the substrate 31 laps over that of the hole provided in the first reflecting member 208. Thereafter, the pipe 209 is inserted into the through hole 32 of the substrate 31 and the hole of the first reflecting member 208 from its one end as deep as possible so that the hook 209a provided at the one end of the pipe 209 is hooked in the hole of the first reflecting member 208, and thus the second reflecting member 211 securely connects the first reflecting member 208 and the substrate 31. Accordingly, at the center of the substrate 31, the second reflecting member 211 is located on the top surface of the substrate 31 (third surface), and the first reflecting member 208, the pipe 209, and the lead wires 210 are located on the bottom surface of the substrate 31 (fourth surface).

Note that this connection connects the lead wires 210 and the lead wires 207 by, for example, a connector(s) provided inside of the first reflecting member 208 (not shown).

Next, on the top surface of the substrate 31, the lead wires 210 are respectively connected to the anode land 33 and the cathode land 34 by means of, for example, soldering.

Thereafter the sub-light source 10 is prepared. The pipe 206 is inserted into the through hole 12 of the substrate 11 from its one end as deep as possible so that the first reflecting member 208 is fixed to the sub-light source 10. Accordingly, at the center of the substrate 11, the first reflecting member 208 is located on the top surface of the substrate 11, and the pipe 206 and the lead wires 207 are located on the bottom surface of the substrate 11.

Subsequently, on the top surface of the substrate 11, the lead wires 207 are respectively connected to the anode land 13 and the cathode land 14 by means of, for example, soldering.

In this way, the light source device 205 including (i) the sub-light source 10, (ii) the first reflecting member 208 fixed to the sub-light source 10, (iii) the sub-light source 30 fixed to the first reflecting member 208, and (iv) the second reflecting member 211 fixed to the sub-light source 30 is produced. The light source device 205 is configured such that the LED chips 15 and 35 emit light when a voltage is applied thereon via the lead wires 207.

(2-3: How to Produce LED Bulb)

The LED bulb 200 having the above-described configuration is produced in the same manner as the above-described LED bulb 100. That is, it is only necessary for the LED bulb 200 to be configured such that the light source device 205 is fixed to the mounting plate 102 by inserting the pipe 206 of the light source device 205 into the through hole of the mounting plate 102 and the globe 104 is fixed to the mounting plate 102 so that the globe 104 covers the light source device 205. This allows the light source device 205 (the sub-light source 10, the first reflecting member 208, the sub-light source 30, and the second reflecting member 211) to be provided at the center of the mounting plate 102. The external dimensions of the LED bulb 200 are the same as those of the LED bulb 100.

(2-4 Summary)

As described above, the LED blub 200 includes the light source device 205, the light source device 205 includes (i) the substrate 11, (ii) at the center of the top surface of the substrate 11, the first reflecting member 208 in a truncated cone shape, which first reflecting member 208 is provided so that a side face of the first reflecting member 208 makes an acute exterior angle with the top surface of the substrate 11, (iii) the plurality of LED chips 15 provided on the top surface of the substrate 11 so as to surround the first reflecting member 208, (iv) the substrate 31 provided on the top surface of the first reflecting member 208 so that a bottom surface of the substrate 31 faces the first reflecting member 208, (v) at the center of the top surface of the substrate 31, the second reflecting member 211 in a truncated cone shape, which second reflecting member 211 is provided so that a side face of the second reflecting member 211 makes an acute exterior angle with the top surface of the substrate 31, and (vi) the plurality of LED chips 35 provided on the top surface of the substrate 31 so as to surround the second reflecting member 211. The first reflecting member 208 and the second reflecting member 211 have, on their respective outer surfaces, light reflecting functions, and the light source device 205 is provided on the mounting plate 102 so that the bottom surface of the substrate 11 faces the mounting plate 102.

According to the above configuration, light emitted from the LED chips 15 can be reflected in a direction of 90° or more with respect to a perpendicular line by the first reflecting member 208 provided on the surface on which the LED chips are provided, assuming that the perpendicular line perpendicular to the top surface of the substrate 11 from a globe 104 side is 0°. Furthermore, light emitted from the second LED chips 35 can be reflected in a direction of 90° or more with respect to the perpendicular line by the second reflecting member 211 provided on the surface on which the LED chips 35 are provided. As a result, a luminous intensity on a mounting plate 102 side can be attained without the need of a complex structure.

Accordingly, the total light distribution angle of the LED bulb 200 is greater compared with that of a conventional LED bulb by summing up emission light from the LED bulb 200 of the present invention. Therefore, it is possible to provide, in a simple configuration, the LED bulb 200 having excellent light distribution characteristics. Furthermore, since the number of a light source and a reflecting part (the sub-light source 30 and the second reflecting member 211) has been increased compared with the LED bulb 100 of Embodiment 1, it is possible to increase a light component within the light distribution angles.

Furthermore, the LED bulb 200 is configured such that, the plurality of LED chips 15 are circularly positioned, at regular intervals, so as to surround the first reflecting member 208, and the plurality of LED chips 35 are circularly positioned, at regular intervals, so as to surround the second reflecting member 211. This makes it possible to obtain uniform emission light. Note that, if the uniform emission light is obtainable, the LED chips 15 and 35 are not limited to be circularly positioned at regular intervals, respectively.

[Embodiment 3]

(3-1: Configuration of LED Bulb)

Figure 7:
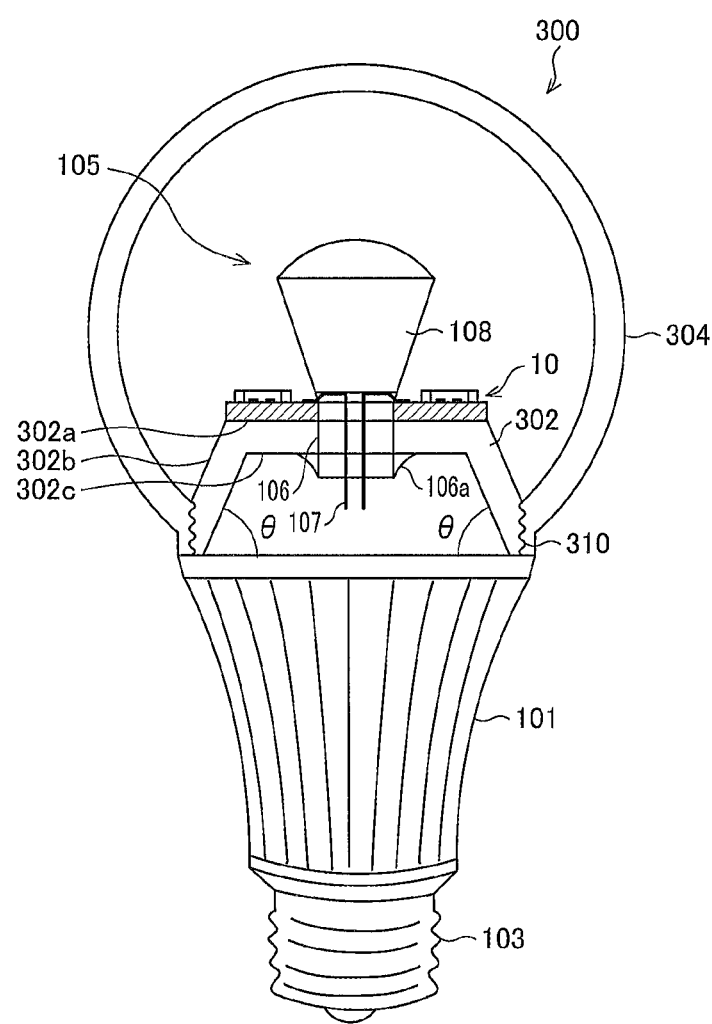
FIG. 7 is a view schematically showing an LED bulb in accordance with Embodiment 3 of the present invention.

FIG. 7 is a view schematically showing one exemplary configuration of an LED bulb 300 in accordance with the present embodiment. As shown in FIG. 7, the LED bulb 300 includes a housing 101, a mounting base 302, a base 103, a globe 304, and a light source device 105. In other words, the LED bulb 300 is configured to include, compared with the LED bulb 100 of Embodiment 1, the mounting base 302 and the globe 304 instead of the mounting plate 102 and the globe 104, respectively.

The mounting base 302 is in a truncated cone shape. The mounting base 302 is fixed to the housing 101 so that its lower surface faces an upper surface of the housing 101. The light source device 105 is provided on an upper surface 302a (mounting surface) of the mounting base 302. An outer surface (at least a side face 302b) of the mounting base 302 has a light reflecting function. Furthermore, the mounting base 302 functions as a heat radiator. The mounting base 302 is made of, for example, aluminum, by which the mounting base 302 performs these functions.

The lower surface of the mounting base 302 has a depressed section 302c. At the center of the upper surface 302a of the mounting base 302, a through hole (for example 8 mm in diameter) that leads to the depressed section 302c is provided. The size of the mounting base 302 is, for example, 2 mm in thickness, and the upper surface 302a is 29 mm in outer diameter that is the same as that of a substrate 11.

A side face 302b of the mounting base 302 is preferably inclined at an exterior angle of 60° to 90° with the upper surface 302a of the mounting base 302. In the present embodiment, an angle of inclination θ is 60°. Note however, in a case where the angle of inclination θ is 90°, the housing 101 can be in a shape of a cylinder or a cuboid.

The globe 304 is a cover made of a resin, and is formed in a shape of a spherical shell. The globe 304 is fixed at a lower part of the side face of the mounting base 302 so as to cover the light source device 105, and the upper surface 302a and the side face 302b of the mounting base 302. The globe 304 is preferably made of, for example, glass, an acrylic or a polycarbonate material in milky white color. The size of the globe 304 is, for example, 60 mm in diameter (outer diameter) and 2.5 mm in thickness.

Note that, in the present embodiment, the light source device 105 includes (i) a sub-light source 10 which is 1 mm in substrate thickness, 29 mm in outer diameter, and 8 mm in diameter of the through hole, and (ii) a reflecting member 108 which is 14 mm in height of a main part, 7.5 mm in height of a pipe part, and 5 mm in height of a lens section.

(3-2: How to Produce LED Bulb)

Next, the following description discusses how to produce the LED bulb 300.

First, the mounting base 302 is prepared. The mounting base 302 is, at this stage, a single unit before being fixed to the housing 101. A pipe 106 of the light source device 105 is inserted into the through hole of the mounting base 302 as deep as possible so that a hook 106a provided at one end of the pipe 106 is hooked by a lower surface of the depressed section 302c of the mounting base 302, and thus the light source device 105 is securely fixed to the mounting base 302. At this stage, at the center of the mounting base 302, the sub-light source 10 and the reflecting member 108 are located on the upper surface 302a of the mounting base 302, and the pipe 106 and lead wires 107 are located on the lower surface of the mounting base 302.

Subsequently, the lead wires 107 are connected to a drive circuit at the lower surface of the mounting base 302. After the connection is completed, the mounting base 302 is fixed to the housing 101. At this stage, the base 103 is fixed to the housing 101 in advance.

Finally, the globe 304 is fixed, with use of, for example, a screw(s) and an adhesive, to the mounting base 302 (a fixing section 310 in FIG. 7) so as to cover the light source device 105 (the sub-light source 10 and the reflecting member 108) arranged on the mounting base 302 and the mounting base 302. This completes production of the LED bulb 300. The size of an external form of the LED bulb 300 is, for example, 60 mm in outer diameter and 110 mm in length.

(3-3: Summary)

As described above, the LED bulb 300 includes (i) the light source device 105, (ii) the mounting base 302 in a truncated cone shape, whose outer surface has a light reflecting function, and (iii) the globe 304 for covering the light source device 105 and the mounting base 302.

According to the configuration, in which the mounting base 302 is provided, it is possible to emit light outside, which light has a wide light distribution angle achieved by the light source device 105 without being blocked by the mounting base 302 (mounting surface). Therefore, the LED bulb 300 can be configured to utilize the wide light distribution angle achieved by the light source device 105 as much as possible.

Note that, in order to utilize the wide light distribution angle as much as possible as described above, the side face 302b of the mounting base 302 is preferably inclined at an exterior angle of 60° to 90° with the upper surface 302a of the mounting base 302, as described earlier.

Furthermore, the housing 101 of the LED bulb 300 is tapered towards a base-side direction. The light source device 105 is mounted on the mounting base 302 which has a large surface area and functions as a heat radiator. This configuration makes it possible to suitably radiate heat generated by the light source device 105.

Furthermore, the upper surface 302a (mounting surface) of the mounting base 302 is preferably shaped in the same size as (a top surface and a bottom surface of) the substrate 11 for the sake of obtaining a luminous intensity toward the base-side direction and facilitating heat radiation.

[Embodiment 4]

(4-1: Configuration of LED Bulb)

Figure 9:
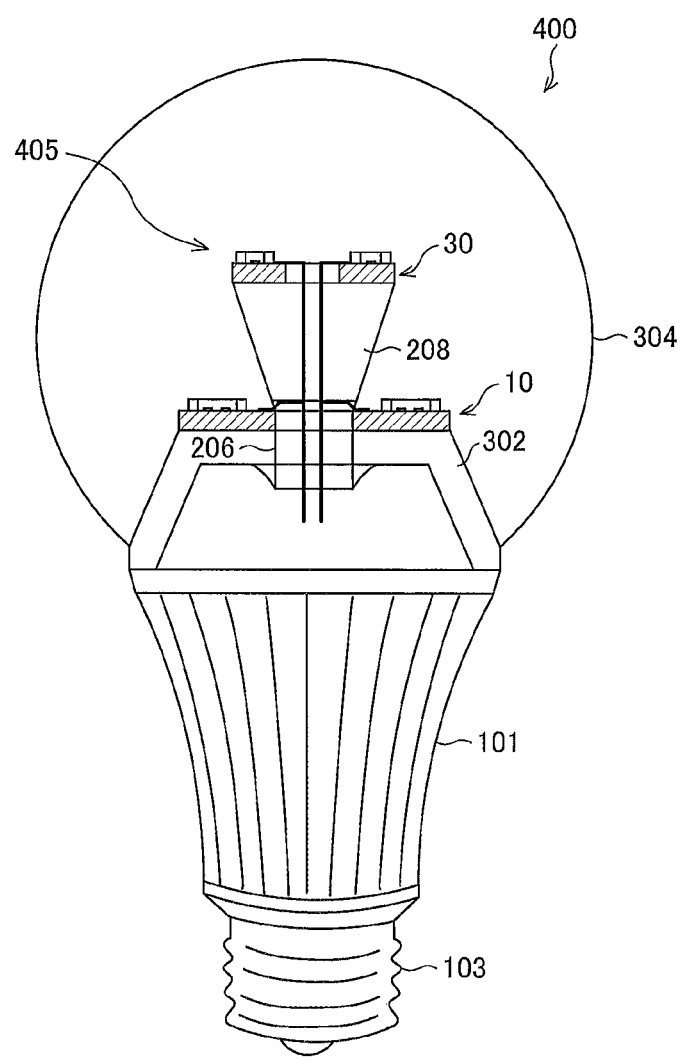
FIG. 9 is a view schematically showing the LED bulb in accordance with Embodiment 4 of the present invention.

FIG. 9 is a view schematically showing one exemplary configuration of an LED bulb 400 in accordance with the present embodiment. As shown in FIG. 9, the LED bulb 400 includes a housing 101, a mounting base 302, a base 103, a globe 304, and a light source device 405. In other words, the LED bulb 400 is configured to include, compared with the LED bulb 300 of Embodiment 3, the light source device 405 instead of the light source device 105.

Figure 8:
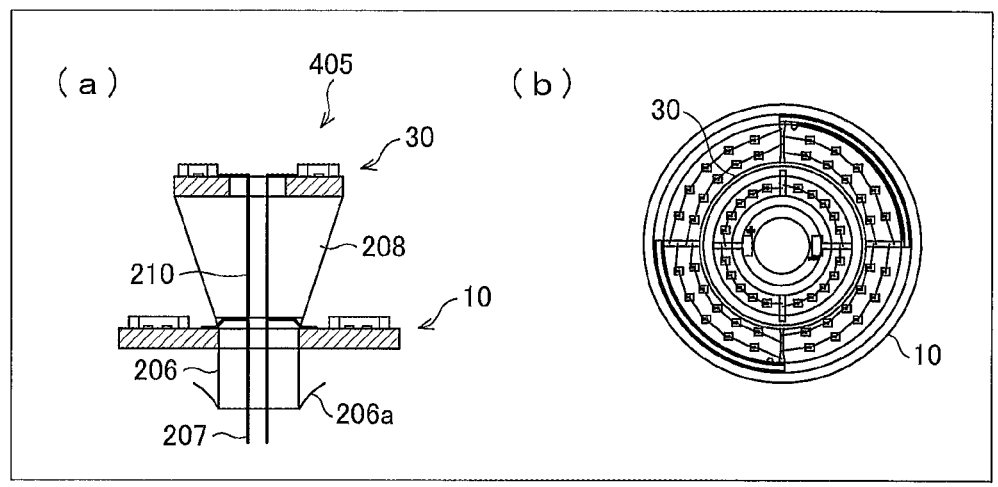
FIG. 8 is a view showing a configuration of a light source device included in an LED bulb illustrated in FIG. 9. (a) of FIG. 8 illustrates a cross sectional structure seen from a side, and (b) of FIG. 8 illustrates the configuration from its top.

FIG. 8 is a view showing one exemplary configuration of the light source device 405. (a) of FIG. 8 illustrates a cross sectional structure seen from a side, and (b) of FIG. 8 is illustrates the configuration from its top. The light source device 405 has the same configuration as that of the light source device 205 shown in FIG. 4 except that the second reflecting member 211 is removed. Note however that, lead wires 210 are left in the light source device 405. A sub-light source 30 can be fixed to a first reflecting member 208 with use of, for example, an adhesive.

In order to emit light efficiently, as explicitly shown in (b) of FIG. 8, a substrate 31 of the sub-light source 30 is preferably located at inner side of a region in which LED chips 15 of a sub-light source 10 are provided. A size of each constituent can be changed as appropriate.

(4-2: How to Produce LED Bulb)

The LED bulb 400 having the above-described configuration is produced in the same manner as the above-described LED bulb 300. That is, it is only necessary for the LED bulb 400 to be configured such that the light source device 405 is fixed to the mounting base 302 by inserting a pipe 206 of the light source device 405 into a through hole of the mounting base 302, and the globe 304 is fixed at a lower part of a side face of the mounting base 302 so that the globe 304 covers the light source device 405 and the mounting base 302. This allows the light source device 405 (the sub-light source 10, the first reflecting member 208, and the sub-light source 30) to be provided at the center of an upper surface of the mounting base 302. The external dimensions of the LED bulb 400 are the same as those of the LED bulb 300.

(4-3: Summary)

As described above, the LED bulb 400 is configured to include the light source device 405. Unlike the light source device 205 shown in FIG. 4, the light source device 405 does not include the second reflecting member 211. However, since the light source device 405 includes the first reflecting member 208, an enough luminous intensity on a mounting plate 302 side can be attained.

Furthermore, the LED bulb 400 is configured to include, compared with the LED bulb 300 shown in FIG. 7, the light source device 405 instead of the light source device 105. Since the light source device 405 further includes the sub-light source 30, a light-emitting intensity just under the light source device (an upward direction in FIG. 9) is greater than that of the light source device 105. Therefore, the LED bulb 400 brings about not only the same effect brought about by the LED bulb 300 but also an effect of further improving the light-emitting intensity.

(4-4: Modification)

Figure 10:
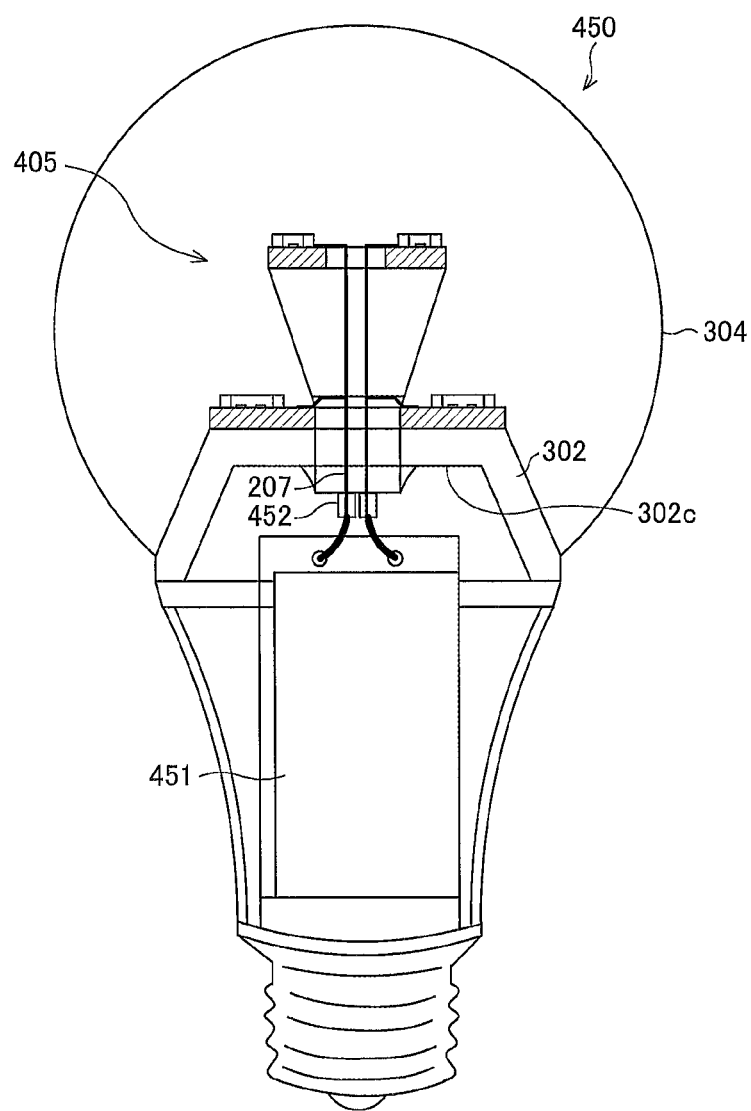
FIG. 10 is a view schematically showing a modification of the LED bulb illustrated in FIG. 9.

A modification of the LED bulb 400 is illustrated in FIG. 10. FIG. 10 is a view schematically showing one exemplary configuration of an LED bulb 450. As shown in FIG. 10, the LED bulb 450 has the same configuration as that of the LED bulb 400 except that a circuit substrate 451 on which a drive circuit is provided.

The circuit substrate 451 is contained inside of the housing 101 and extended into a depressed section 302c of the mounting base 302. Lead wires 207 of the light source device 405 and the drive circuit of the circuit substrate 451 are electrically connected via respective connectors 452. The size of the circuit substrate 451 is, for example, 40 mm in height (length) and 20 mm in width.

As described above, a part of the circuit substrate 451 can be accommodated in the depressed section 302c of the mounting base 302. Making good use of the depressed section 302c of the mounting base 302 as an accommodation space for the circuit substrate 451 can contribute to down-sizing of the LED bulb 450.

[Embodiment 5]

Figure 11:
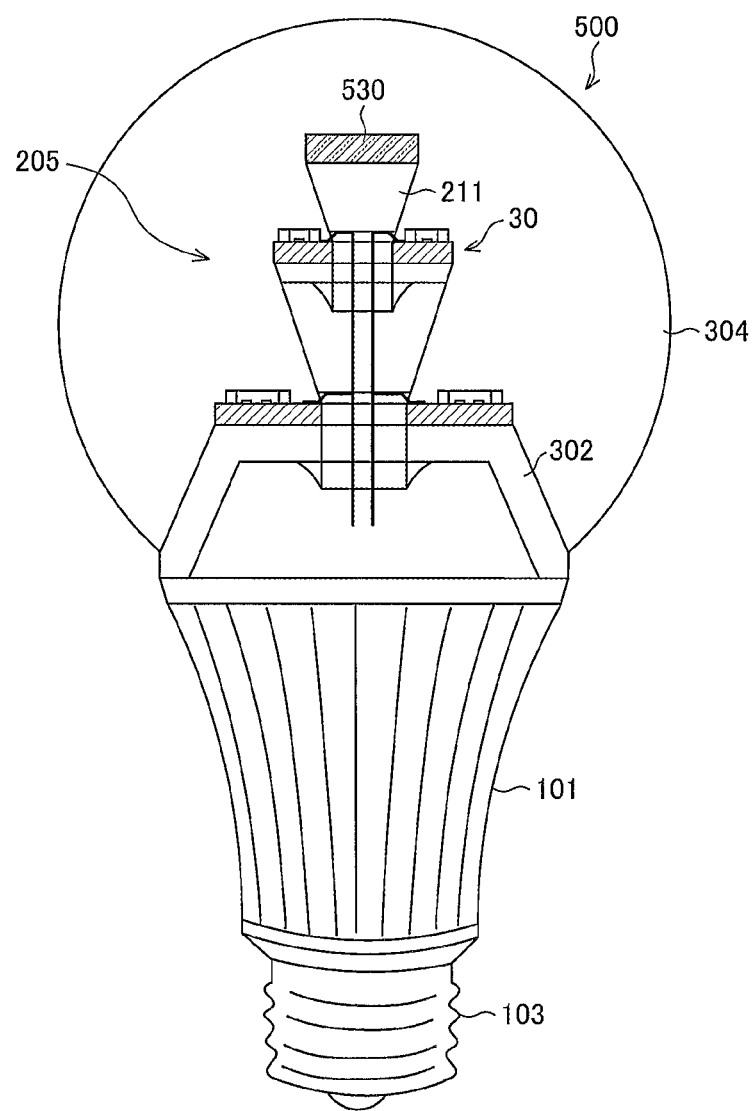
FIG. 11 is a view schematically showing an LED bulb in accordance with Embodiment 5 of the present invention.

FIG. 11 is a view schematically showing one exemplary configuration of an LED bulb 500 in accordance with the present embodiment. As shown in FIG. 11, the LED bulb 500 includes a housing 101, a mounting base 302, a base 103, a globe 304, a light source device 205, and a sensor 530. In other words, the LED bulb 500 is configured to include the light source device 205 instead of the light source device 405 and further include the sensor 530, compared with the LED bulb 400 of Embodiment 4.

The sensor 530 is a motion sensor detecting presence of a person (moving object). The sensor 530 is provided on a top surface of a second reflecting member 211 of the light source device 205. The light source device 205 is turned on and off in response to a result of detection carried out by the sensor 530. For example, the light source device 205 may be provided with lead wires (not shown) for transmitting to the driving circuit an electric current generated in the sensor 530 when the sensor 530 detects a person (moving object). With this configuration, the drive circuit is enabled to control power supply to the light source device 205 in order to switch ON and OFF of the light source device 205. The lead wires may be in, for example, a through hole 32 of a substrate 31.

With the sensor 530, it is possible for the LED bulb 500 to turn on the light source device 205 when the sensor 530 detects a person (moving object), and turn off the light source device 205 when the sensor 530 detects no person (moving object). This makes it possible to reduce electric power consumption.

Note that the sensor 530 can be, for example, an infrared sensor or a sound sensor. Accordingly, the LED bulb 500 can be configured to be an LED bulb with a built-in motion sensor or an LED bulb with a built-in sound sensor. Furthermore, a position in which the sensor 530 is located can be any appropriate position without being limited to the top surface of the second reflecting member 211.

[Embodiment 6]

(6-1: Configuration of LED Bulb)

Figure 13:
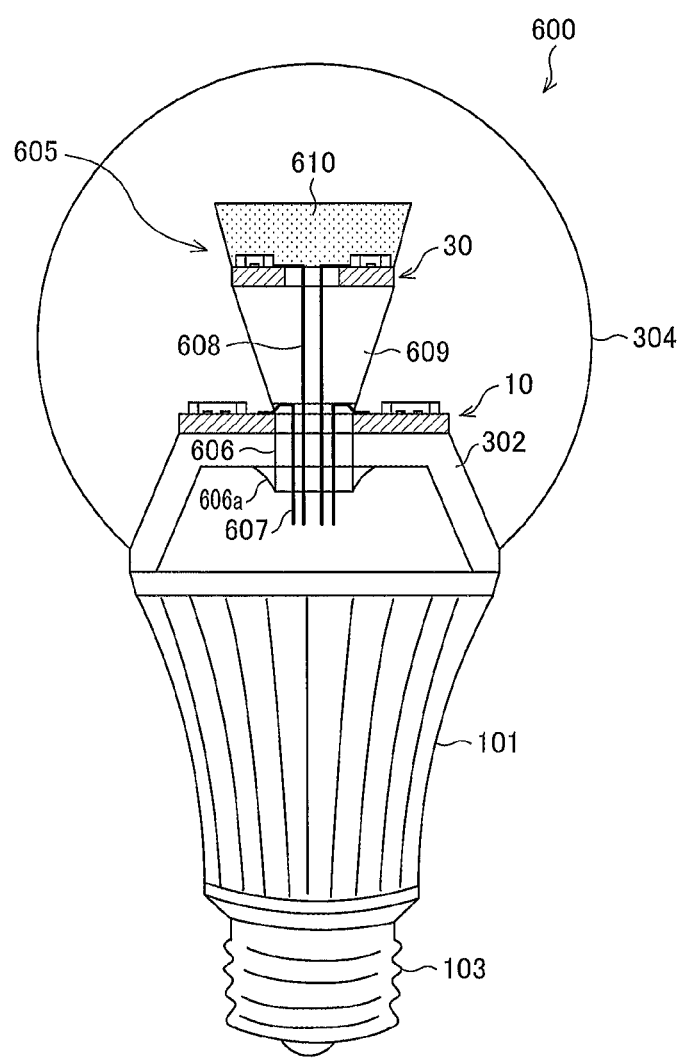
FIG. 13 is a view schematically showing the LED bulb in accordance with Embodiment 6 of the present invention.

FIG. 13 is a view schematically showing one exemplary configuration of an LED bulb 600 in accordance with the present embodiment. As shown in FIG. 13, the LED bulb 600 includes a housing 101, a mounting base 302, a base 103, a globe 304, and a light source device 605. That is, the LED bulb 600 is configured to include, compared with the LED bulb 300 of Embodiment 3, the light source device 605 instead of the light source device 105.

The light source device 605 is a light-emitting device in which an LED is employed as a light source. The light source device 605 has a pipe 606 having a function like that of a rivet for installation. At one end of the pipe 606, a hook 606a having a hooking part is formed. The light source device 605 is fixed to the mounting base 302 by causing the hook 606a to be hooked by a mounting plate 102 when the pipe 606 is inserted into a through hole of the mounting base 302. This allows the light source device 605 to be provided at the center of the mounting base 302.

Furthermore, the light source device 605 has two first lead wires 607 (voltage applying terminals), one of which is for a cathode and the other of which is for an anode, and two second lead wires 608 (voltage applying terminals), one of which is for a cathode and the other of which is for an anode. The first lead wires 607 and the second lead wires 608 are provided inside the pipe 606. In the pipe 606, the first lead wires 607 and the second lead wires 608 are guided into the housing 101 via the through hole of the mounting base 302, thereby being electrically connected to a drive circuit contained in the housing 101.

(6-2: Configuration of Light Source)

Next, a configuration of the light source device 605 is described.

Figure 12:
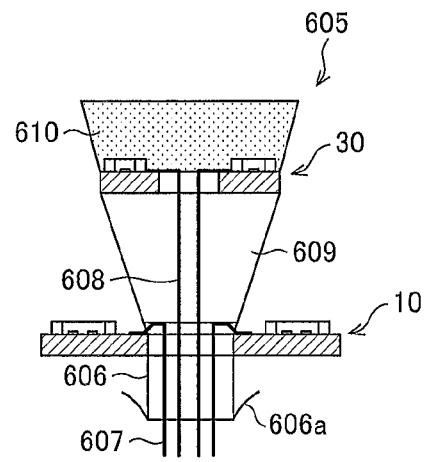
FIG. 12 is a cross sectional view showing a configuration of a light source device included in an LED bulb illustrated in FIG. 13.

FIG. 12 is a cross sectional view showing one exemplary configuration of the light source device 605. As shown in FIG. 12, the light source device 605 is constituted by a sub-light source 10, a reflecting member 609, a sub-light source 30, and a reflector 610.

In other words, the light source device 405 is configured to include the reflector 610 in addition to the configuration of the light source device 405 shown in FIG. 8. The lead wires 207 and the lead wires 210 of the light source device 405 shown in FIG. 8 correspond to the first lead wires 607 and the second lead wires 608 of the light source device 605 shown in FIG. 12, respectively. In the light source device 405, the lead wires 207 and the lead wires 210 are connected by a connector(s), whereas in the light source device 605, the lead wires 607 and the lead wires 608 are individually guided into the housing 101.

(6-2-1: Reflecting Member)

As shown in FIG. 12, the reflecting member 609 is in an inverted truncated cone shape. At the center of the sub-light source 10, the reflecting member 609 is provided so that its upper surface is located in an upward direction and its lower surface is located in a downward direction. In other words, the reflecting member 609 is in a truncated cone shape, and is provided so that a side face of the reflecting member 609 makes an acute exterior angle with a top surface of a substrate 11 of the sub-light source 10. An outer surface (at least the side face) of the reflecting member 609 has a light reflecting function.

The upper surface (top surface) of the reflecting member 609 is flat. The upper surface of the reflecting member 609 is provided with the sub-light source 30. At the center of the upper surface of the reflecting member 609, there is provided a through hole that penetrates from the upper surface to a lower surface of the reflecting member 609. The second lead wires 608 are guided into the through hole. The pipe 606 and the first lead wires 607 are provided at the lower surface (bottom surface) of the reflecting member 609. The material and the size of the reflecting member 609 can be the same as those of the above-described first reflecting member 208.

(6-2-2: Reflector)

As shown in FIG. 12, the reflector 610 is a reflecting plate formed on the top surface of a substrate 31 of the sub-light source 30 so as to surround an outer side of a light source section which is formed in a ring shape and includes LED chips 35. The reflector 610 is formed along an outer edge of the substrate 31. With the reflector 610, a light distribution angle of light emitted from the light source section which is formed in a ring shape and includes the LED chips 35 can be controlled. The reflector 610 is shaped in a box-shape having a hollow therein (cylindrical shape having an external form of an inverted truncated cone is used in the present embodiment), and is provided so as to cover the light source section which is formed in a ring shape and includes the LED chips 35.

Since the reflector 610 is fixed so as to cover the light source section which is formed in a ring shape and includes the LED chips 35, installation of the reflector 610 can be carried out at any timing as appropriate during assembling of the light source device 605. The process of assembling of the light source device 605 is almost the same as that of the above-described light source device 205. Note that a space surrounded by the reflector 610 is not filled with, for example, a sealing resin.

A preferable material for the reflector 610 is, for example, glass, an acrylic material, a polycarbonate material, etc. in white or milky white color. In the present embodiment, a white polycarbonate resin is selected. Furthermore, the size of the reflector 610 is 7 mm in height and 20 mm in outer diameter.

(6-3: How to Produce LED Bulb)

The LED bulb 600 having the above-described configuration is produced in the same manner as the above-described LED bulb 300. That is, it is only necessary for the LED bulb 600 to be configured such that the light source device 605 is fixed to the mounting base 302 by inserting the pipe 606 of the light source device 605 into the through hole of the mounting base 302 and the globe 304 is fixed at a lower part of a side face of the mounting base 302 so that the globe 304 covers the light source 605 and the mounting base 302. This allows the light source device 605 (the sub-light source 10, the reflecting member 609, the sub-light source 30, and the reflector 610) to be provided at the center of an upper surface of the mounting base 302. The external dimensions of the LED bulb 600 are the same as those of the LED bulb 300.

(6-4: Summary)

As described above, the LED bulb 600 includes the light source device 605 having the reflector 610. This makes it possible to increase a light component above the reflector 610. With this configuration, the LED bulb 600 can be used, for example, as a spot light.

Furthermore, the LED bulb 600 is individually provided with (i) the first lead wires 607 serving as voltage applying terminals (2 terminals in total) for applying a voltage to the LED chips 15 of the sub-light source 10 and (ii) the second lead wires 608 serving as voltage applying terminals (2 terminals in total) for applying a voltage to the LED chips 35 of the sub-light source 30. This makes it possible to independently operate the LED chips 15 and the LED chips 35. For example, the LED chips 15 and the LED chips 35 can be operated such that if strong light needs to be emitted, the LED chips 15 and the LED chips 35 are turned on together. If strong light needs not to be emitted, only the LED chips 15 is turned on.

Therefore, it is possible for the LED bulb 600 to (i) increase a variety of how to emit light and (ii) achieve reduction in electric power consumption by selectively switching between lighting of the LED chips 15 and lighting of the LED chips 35.

(6-4: Modifications)

Other examples of lighting of the light source device 605 are provided as below. Note that the light source device 605 can be configured without the reflector 610.

For example, the sub-light source 30 is configured to include red LEDs as the LED chips 35 and a non-fluorescent material-containing resin as the sealing resin 38. In this case, it is possible to easily obtain emission light with high color-rendering by independently operating the LED chips 15 and the LED chips 35.

For example, the sensor 530 is installed near the LED bulb 600. With this configuration, in a case where the LED bulb 600 is in a stand-by mode or no person is present near the LED bulb 600, only the LED chips 35 are turned on by the LED bulb 600 by applying a voltage to only the second lead wires 608. In a case where a person is approaching to or present near the LED bulb 600, both of the LED chips 15 and the LED chips 35 are turned on by the LED bulb 600 by applying a voltage to both of the first lead wires 607 and the second lead wires 608 in response to detection of the person by the sensor 530. With this configuration, electric power consumed by the LED bulb 600 is small in the case where the light bulb 600 is in a stand-by mode, no person is closed to the LED bulb 600, at night, etc., and thus it is possible to reduce electric power consumption. Therefore, it is possible to realize an excellent illumination device.

As described above, by including the light source 605 which is capable of independently operating the LED chips 15 and the LED chips 35, it is possible to realize the LED bulb 600 in which a high light distribution, a high color-rendering, a function as a spot light, and reduction of electric power consumption have been achieved.

[Embodiment 7]

(7-1: Configuration of LED Bulb)

Figure 14:
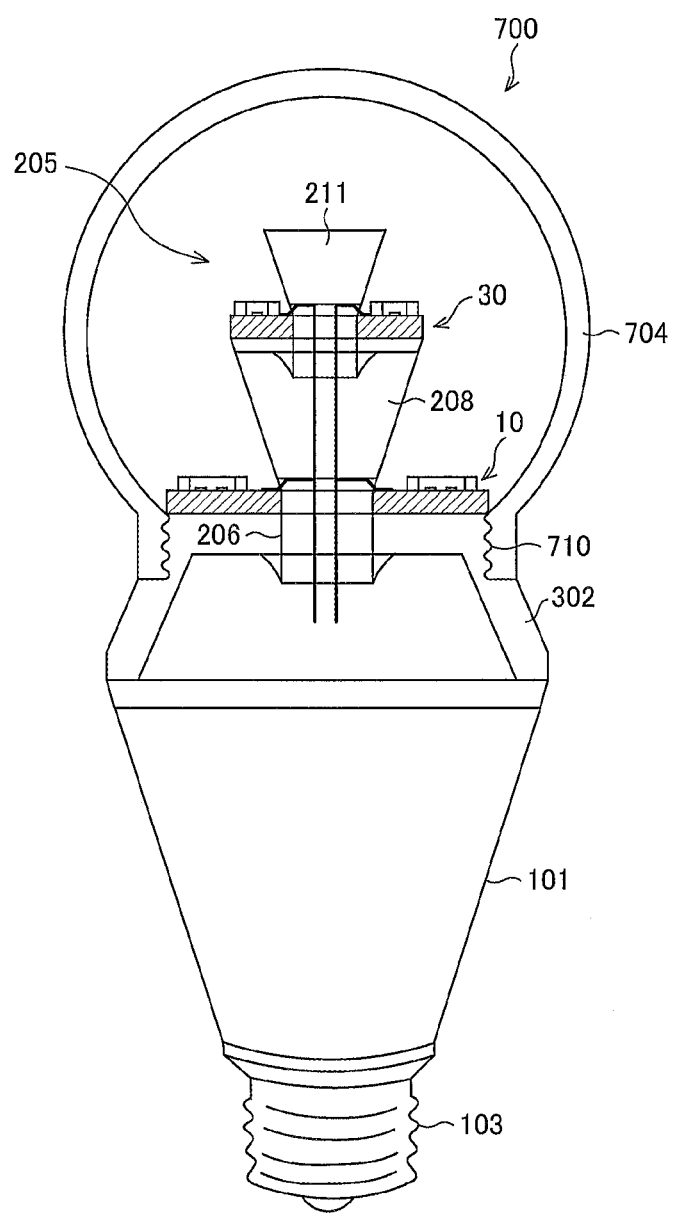
FIG. 14 is a view schematically showing an LED bulb in accordance with Embodiment 7 of the present invention.

FIG. 14 is a view schematically showing one exemplary configuration of an LED bulb 700 in accordance with the present embodiment. As shown in FIG. 14, the LED bulb 700 includes a housing 101, a mounting base 302, a base 103, a globe 704 and a light source device 205. In other words, the LED bulb 700 is configured to include, compared with the LED bulb 300 of Embodiment 3, the light source device 205 and the globe 704 instead of the light source device 105 and the globe 304, respectively.

The globe 704 is a cover made of a resin, and is formed in a shape of a spherical shell. The globe 704 is fixed to an upper part of a side face of the mounting base 302 so as to cover the light source device 205. The globe 704 is made of for example, an acrylic, polycarbonate, silicone or epoxy resin. In particular, the acrylic and polycarbonate resins are preferable as the material of the globe 704 since these resins are excellent in moldability, heat-resisting property (against heat from a light source, a drive circuit and the like), and weather resistance. The globe 704 is made of a white polycarbonate resin in this present embodiment. The size of the globe 704 is, for example, 45 mm in diameter (outer diameter) and 2.5 mm in thickness.

(7-2: How to Produce LED Bulb)

The LED bulb 700 having the above-described configuration is produced in the same manner as the above-described LED bulb 300 except that the position in which the globe 704 is fixed is different. That is, it is only necessary for the LED bulb 700 to be configured such that the light source device 205 is fixed to the mounting base 302 by inserting a pipe 206 of the light source device 205 into a through hole of the mounting base 302, and the globe 704 is fixed at an upper part of a side face of the mounting base 302 so that the globe 704 covers the light source device 205. The globe 704 can be connected to the mounting base 302 with use of, for example, an adhesive (bond) or a combination of a screw(s) and the adhesive (bond). In this embodiment, the globe 704 is fixed, with use of the screw(s) and the adhesive (a fixing section 710 of FIG. 14). This allows the light source device 205 (the sub-light source 10, the first reflecting member 208, the sub-light source 30, and the second reflecting member 211) to be provided at the center of an upper surface of the mounting base 302.

(7-3: Summary)

As described above, in the LED bulb 700, the globe 704 is fixed at the upper part of the side face of the mounting base 302 so that the globe 704 covers the light source device 205. This allows, in the globe 704, the sub-light source 10 to be located in a lower part and the sub-light source 30 to be located in a middle part. Therefore, it is possible for the LED bulb 700 to obtain wide light distribution characteristics spreading in all directions of an upward direction, a lateral direction and a downward direction (a globe direction and a base-side direction). A result will be described later with an evaluation result.

(7-4: Modified Example)

The globe 704 can be configured to be detachable by, for example, using only the screw(s) at the fixing section 710. Furthermore, the globe 704 can be made of by a fluorescent material containing resin. These configurations allow easy chromaticity adjustment in the LED bulb 700.

For example, a white LED bulb can be obtained by constituting the light source device 205 by (i) causing LED chips 15 of the sub-light source 10 and LED chips 35 of the sub-light source 30 to be blue LED chips, (ii) constituting sealing resins 19 and 38 with a transparent resin(s) (no fluorescent material is contained), and, in addition to the configuration of the light source device 205, (iii) constituting the globe 704 with a resin containing a fluorescent material (adding the fluorescent material to the above-mentioned resin).

In this configuration, light emission of the blue LED chips 15 and 35 of the respective sub-light sources 10 and 30 result in (i) blue light having gone through multiple reflection in the globe 704, (ii) blue light reflected by the first reflecting member 208 and the second reflecting member 211 and (iii) blue light which directly enters the globe 704 from the transparent sealing resins 19 and 38, and the three types of blue light are converted in color in the globe 704. As a result, white light is obtained.

Therefore, it is possible to easily carry out changing and adjustment of emission light from day white to warm white by exchanging one globe 704 to another globe 704 in which an amount and a type of the fluorescent material contained in the fluorescent material containing resin are changed in accordance with a desired chromaticity.

The color of the globe 704 is the same as that of the fluorescent material contained in the resin. Note that, the globe 704 is not limited to in a single layer structure but also can be in a multilayer structure. For example, in a case where the globe 704 is in a double-layer structure, in one case, an inner side can be a fluorescent material containing resin layer and an outer side can be a transparent resin layer or, in another case, the inner side can be the transparent resin layer and the outer side can be the fluorescent material containing resin layer. In a case where the globe 704 is in a multilayer structure, it is only necessary that at least one of the layers be constituted by the fluorescent material containing resin layer.

Furthermore, emission light of a light source section of the sub-light source 10 (a ring-shaped light emitting part constituted by the LED chips 15 and the sealing resin 19) and a light source section of the sub-light source 30 (a ring-shaped light emitting part constituted by the LED chips 35 and the sealing resin 38) can be determined so that each of the light source sections is to be an excitation light source for exciting the fluorescent material.

[Embodiment 8]

(8-1: Configuration of LED Bulb)

Figure 16:
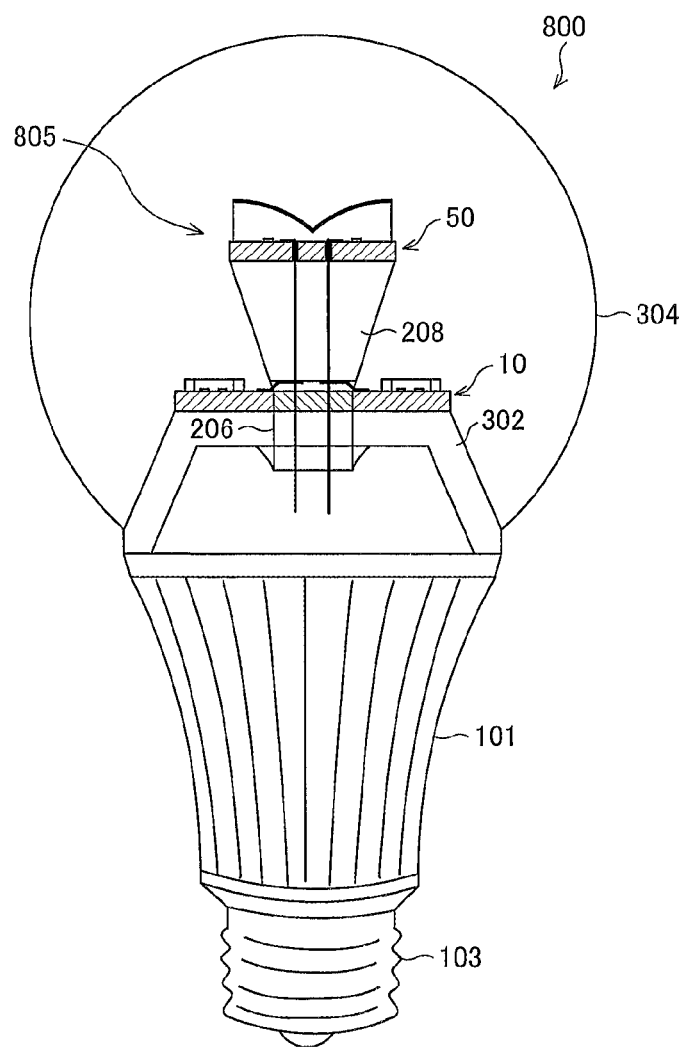
FIG. 16 is a view schematically showing the LED bulb in accordance with Embodiment 8 of the present invention.

FIG. 16 is a view schematically showing one exemplary configuration of an LED bulb 800 in accordance with the present embodiment. As shown in FIG. 16, the LED bulb 800 includes a housing 101, a mounting base 302, a base 103, a globe 304, and a light source device 805. In other words, the LED bulb 800 is configured to include, compared with the LED bulb 300 of Embodiment 3, the light source device 805 instead of the light source device 105.

The light source device 805 is a light-emitting device in which an LED is employed as a light source. The light source device 805 has a pipe 206 having a function like that of a rivet. At one end of the pipe 206, a hook 206a having a hooking part is formed. The light source device 805 is fixed to the mounting base 302 by causing the hook 206a to be hooked by the mounting base 302 when the pipe 206 is inserted into a through hole of the mounting base 302. This allows the light source device 805 to be provided at the center of the mounting base 302.

Furthermore, the light source device 805 has two lead wires 207, one of which is for a cathode and the other of which is for an anode. In the pipe 206, the lead wires 207 are guided to the housing 101 via the through hole of the mounting base 302, thereby being electrically connected to a drive circuit contained in the housing 101.

(8-2: Configuration of Light Source)

Next, a configuration of the light source device 805 is described.

Figure 15:
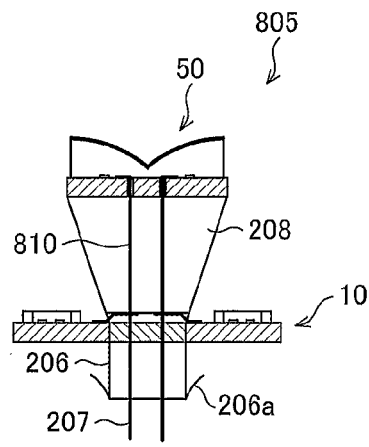
FIG. 15 is a cross sectional view showing a configuration of a light source device included in an LED bulb illustrated in FIG. 16.

FIG. 15 is a cross-sectional view showing one exemplary configuration of the light source device 805. As shown in FIG. 15, the light source device 805 is constituted by a sub-light source 10, a first reflecting member 208 and a sub-light source 50.

(8-2-1: Sub-light Source)

Figure 17:
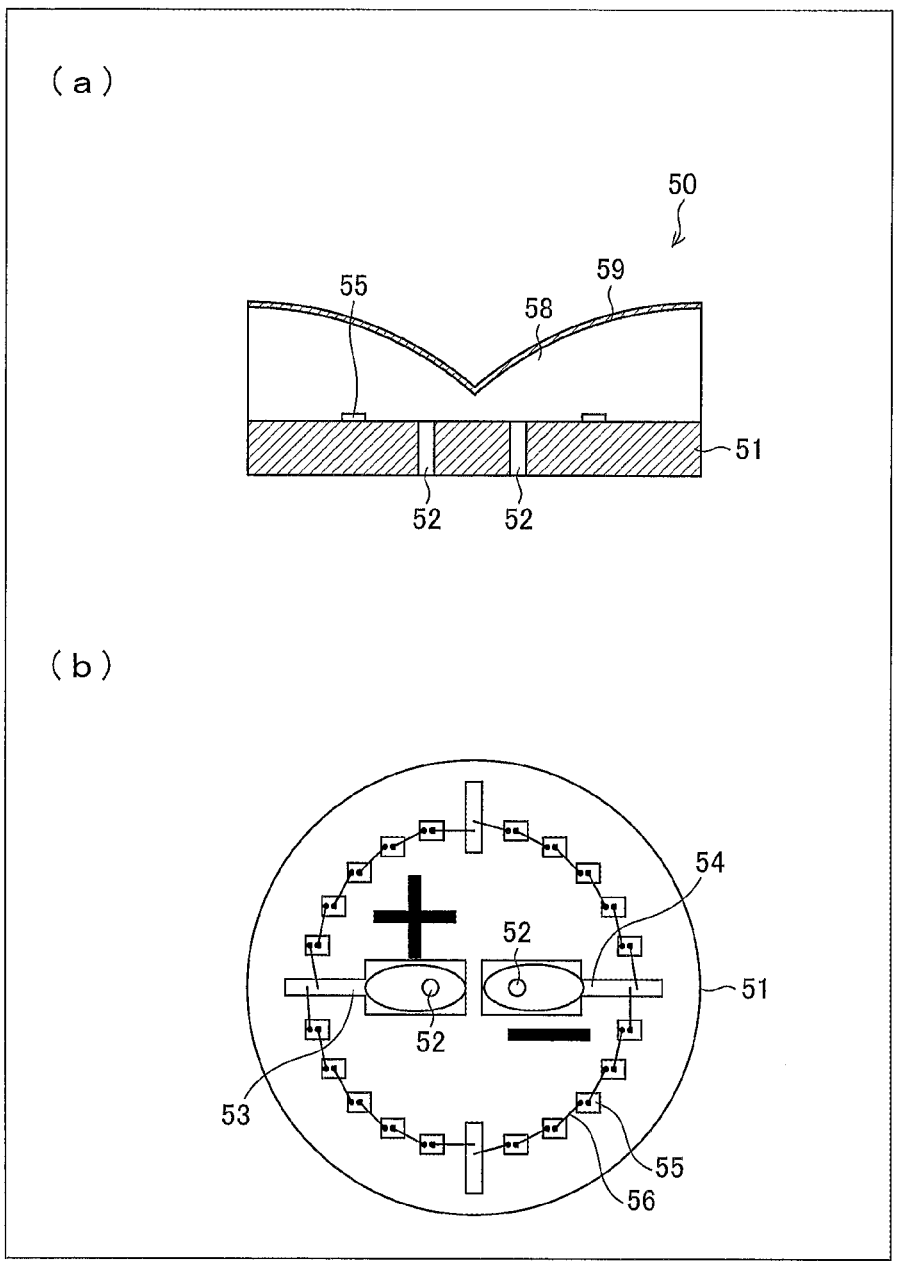
FIG. 17 is a view showing further another exemplary configuration of a sub-light source. (a) of FIG. 17 illustrates a cross sectional structure seen from a side, and (b) of FIG. 17 illustrates the configuration from its top.

FIG. 17 is a view showing one exemplary configuration of the sub-light source 50. (a) of FIG. 17 illustrates a cross sectional structure seen from a side, and (b) of FIG. 17 illustrates the configuration viewed from its top. As shown in FIG. 17, the sub-light source 50 includes a substrate 51 (second substrate), LED chips 55 (light-emitting elements, second light-emitting elements) and a sealing resin 58.

The substrate 51 is a ceramic substrate on which a wiring pattern is formed. The substrate 51 is formed in a circular shape in a planer view, and at its center, two through holes 52 are provided. The through holes 52 are holes for wiring, and at least two through holes 52 are necessary. Note that a diameter of the substrate 51 is preferably made smaller than that of a substrate 11 so as to reduce, as much as possible, blocking of the light emitted by the sub-light source 10.

The wiring pattern is formed on one surface (hereinafter referred to as a top surface) of the substrate 51 (third surface). The wiring pattern includes an anode land 53 and a cathode land 54 etc. each of which is capable of being connected to outside. The anode land 53 and the cathode land 54 are provided on a circumference side of each of the through holes 52. The size of the substrate 51 is, for example 17 mm in diameter (outer diameter), and 1 mm in thickness. The diameter of the through hole 52 is 2 mm.

The LED chips 55 are, but not limited to, blue LEDs. The LED chips 55 are directly provided on the top surface of the substrate 51. The plurality of LED chips 55 are provided (20 LED chips are provided in the present embodiment), and arranged in one circular line concentrically with the substrate 51. The LED chips 55 are arranged at regular intervals herein, but may not be arranged at regular intervals. The plurality of LED chips 55 are electrically connected between the anode land 53 and the cathode land 54 in a 10-in-series and 2-in-parallel configuration (in which each 10 LED chips are connected in series and each 2 such connected lines are connected in parallel). The LED chips 55 are directly connected to each other via a gold wire 56 in a wire bonding method. Furthermore, the LED chips 55 and the wiring pattern are also connected to each other via a gold wire 56 in the wire bonding method.

The sealing resin 58 is a resin layer for sealing the LED chips 55. The sealing resin 58 is formed, on the top surface of the substrate 51, along an outer edge of the substrate 51 so as to embed all the LED chips 55 in the sealing resin 58. The sealing resin is made of an insulating resin material containing a fluorescent material, for example, made of a fluorescent material containing silicone resin. A top surface of the sealing material 58 is in a funnel shape depressing at the center. Furthermore, a metal layer 59 having a light reflecting function is formed on the top surface of the sealing resin 58.

The sealing resin 58 is formed in the following process. First, on the substrate 51 on which pre-diced LED chips 55 are provided, a resin in a liquid state is applied to the substrate 51 and the pre-diced LED chips 55. Then, before the resin in the liquid state completely cures, a metal mold is pressed from above onto the substrate 51 (so as to form the funnel shape). This forms a sealing shape whose center part dents downwardly on the top surface of the cured sealing resin 58. Then, on the top surface of the cured sealing resin 58, the metal layer 59 is formed. In the end, the substrate 51 is diced by dicing. This allows the sealing resin 58 having the metal layer 59 to be formed along the outer edge of the substrate 51.

(8-2-2: Assembling of Sub-light Source and Reflecting Member)

The anode land 53 and the cathode land 54 of the sub-light source 50 and lead wires 810 are connected with one another by means of, for example, soldering in advance. The lead wires 810 are guided to a bottom surface (fourth surface) of the substrate 51 via the through holes 52. First, the sub-light source 50 with the lead wires 810 is fixed on a top surface of the first reflecting member 208. This fixing causes the lead wires 810 to be respectively connected to the lead wires 207 by, for example, a connector(s) (not shown).

Thereafter the sub-light source 10 is prepared. The pipe 206 is inserted into the through hole 12 of the substrate 11 from its one end as deep as possible so that the first reflecting member 208 is fixed to the sub-light source 10. Accordingly, at the center of the substrate 11, the first reflecting member 208 is located on the top surface of the substrate 11, and the pipe 206 and the lead wires 207 are located on the bottom surface of the substrate 11.

Subsequently, on the top surface of the substrate 11, the lead wires 207 are respectively connected to the anode land 13 and the cathode land 14 by means of, for example, soldering.

In this way, the light source device 805 including (i) the sub-light source 10, (ii) the first reflecting member 208 fixed to the sub-light source 10, (iii) the sub-light source 50 fixed to the first reflecting member 208 is produced. The light source device 805 is configured such that the LED chips 15 and 35 emit light when a voltage is applied thereon via the lead wires 207.

(8-3: How to Produce LED Bulb)

The LED bulb 800 having the above-described configuration is produced in the same manner as the above-described LED bulb 300. That is, it is only necessary for the LED bulb 800 to be configured such that the light source device 805 is fixed to the mounting base 302 by inserting the pipe 206 of the light source device 805 into the through hole of the mounting base 302 and the globe 304 is fixed at a lower part of a side face of the mounting base 302 so that the globe 304 covers the light source device 805 and the mounting base 302. This allows the light source device 805 (the sub-light source 10, the first reflecting member 208 and the sub-light source 50) to be provided at the center of an upper surface of the mounting base 302.

(8-4: Summary)

As described above, the LED bulb 800 includes the light source device 805, the light source device 805 includes (i) the substrate 11, (ii) at the center of the top surface of the substrate 11, the first reflecting member 208 in a truncated cone shape which is provided so that a side face of the first reflecting member 208 makes an acute exterior angle with the top surface of the substrate 11, and (iii) the plurality of LED chips 15 provided on the top surface of the substrate 11 so as to surround the first reflecting member 208, (iv) the substrate 51 provided on the top surface of the first reflecting member 208 so that the bottom surface of the substrate 51 faces the first reflecting member 208, (v) the plurality of LED chips 55 provided on the top surface of the substrate 51, and (vi) the sealing resin 58 which is formed on the top surface of the substrate 51 so as to embed all the LED chips 55 in the sealing resin 58. The top surface of the sealing resin 58 is in the funnel shape depressing at the center and the metal layer 59 having the light reflecting function is formed on the top surface of the sealing resin 58. The light source 805 is provided on the mounting base 302 so that the bottom surface of the substrate 11 faces the mounting base 302.

According to the above configuration, light emitted from the LED chips 15 can be reflected in a direction of 90° or more with respect to a perpendicular line by the first reflecting member 208 provided on the surface on which the LED chips are provided, assuming that the perpendicular line perpendicular to the top surface of the substrate 11 from a globe 304 side is 0°.

Furthermore, LED light emitted by the LED chips 55 and fluorescence light emitted by the fluorescent material excited by the LED light are emitted in a lateral direction and in a base-side direction on being reflected by the metal layer 59. This increases a light component of the LED bulb 800 in the lateral direction and the base-side direction. As a result, a luminous intensity on a mounting base 302 side can be attained without the need of a complex structure.

Accordingly, the total light distribution angle of the LEB bulb 800 is greater compared with that of a conventional LED bulb by summing up emission light from the LEB bulb 800 of the present invention. Therefore, it is possible to provide, in a simple configuration, the LED bulb 800 having excellent light distribution characteristics.

Note that, in a case where the globe 304 is made of a resin containing a fluorescent material (so as to make a fluorescent material containing resin layer), the sealing resin 58 can be made of a transparent resin (so as to make a non-fluorescent material-containing resin layer). Also in this case, almost the same advantage can be obtained.

EXAMPLE

Figure 18:
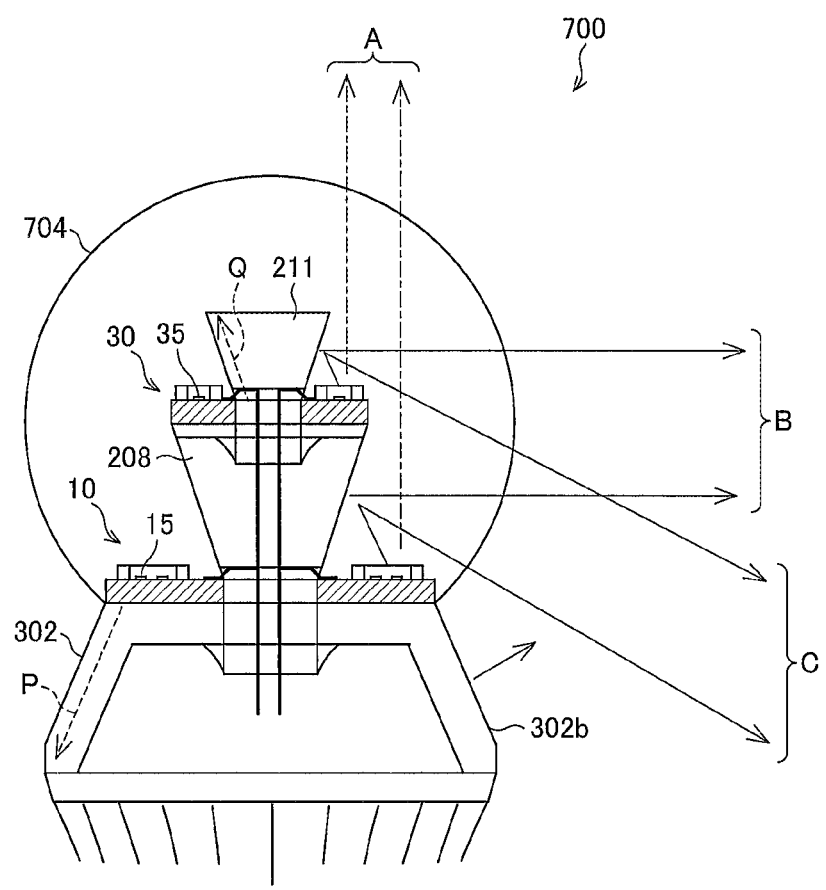
FIG. 18 is a view explaining optical paths of light emitted by the LED bulb illustrated in FIG. 14.

As one example, light distribution characteristics of the LED bulb 700 of Embodiment 7 of FIG. 14 were demonstrated, (in which, the globe 704 contained no fluorescent material and the sealing resins 19 and 38 contained a fluorescent material). The following explains first how light is reflected in the LED bulb 700. FIG. 18 is a view explaining optical paths of light emitted by the LED bulb 700.

"A" in FIG. 18 indicates light in an upward direction. Light emitted from the LED chips 15 and and not reflected by either the first reflecting member 208 or the second reflecting member 211 is emitted in the upward direction.

"B" in FIG. 18 indicates light in a lateral direction and "C" indicates light in a base-side direction. Light emitted from the LED chips 15 and 35 and reflected by the first reflecting member 208 and the second reflecting member 211 is emitted in the lateral direction or the base-side direction depending on which direction the light enters the first reflecting member 208 and the second reflecting member 211.

Furthermore, a side face 302b of the mounting base 302 also reflects light, thereby contributing an increase in light component of the LED bulb 700. The side face 302b is provided in a position where a luminous intensity of the light "C" is not blocked.

Figure 19:
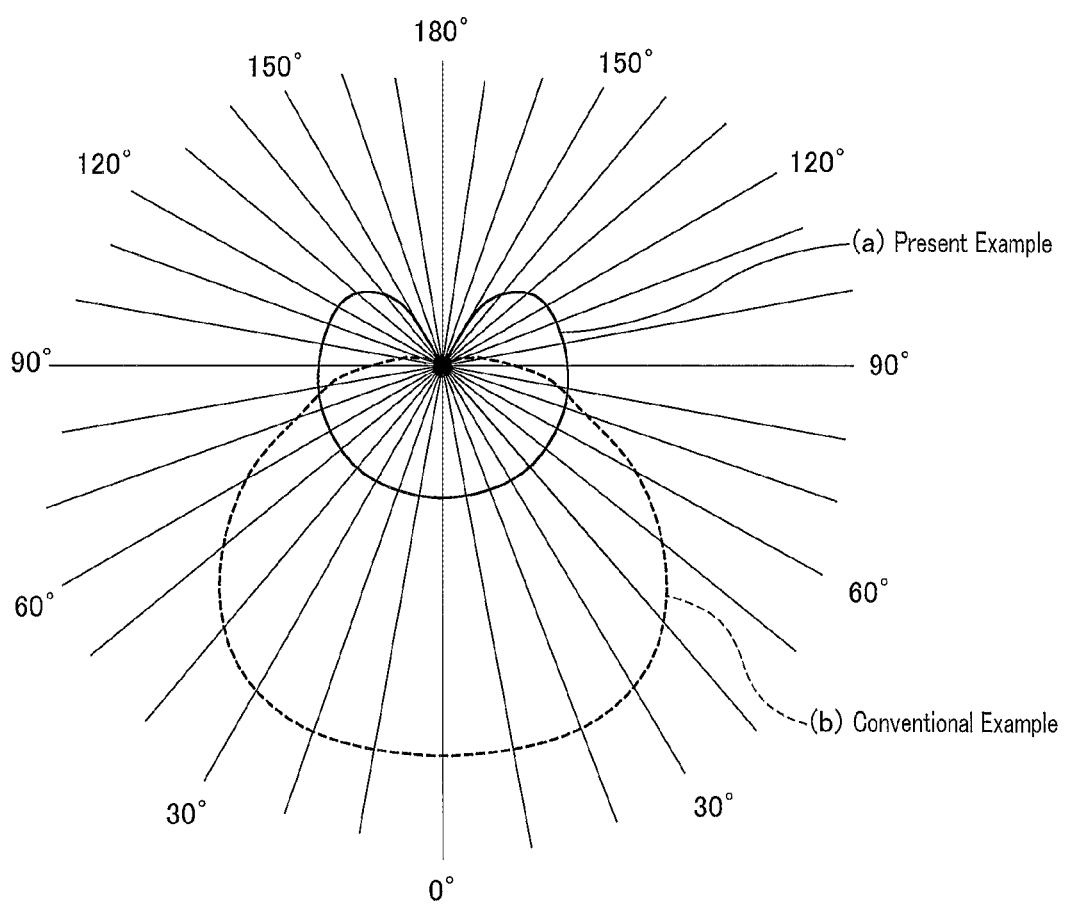
FIG. 19 is a view showing a result of measurement of light distribution characteristics of the LED bulb illustrated in FIG. 14.
Figure 20:
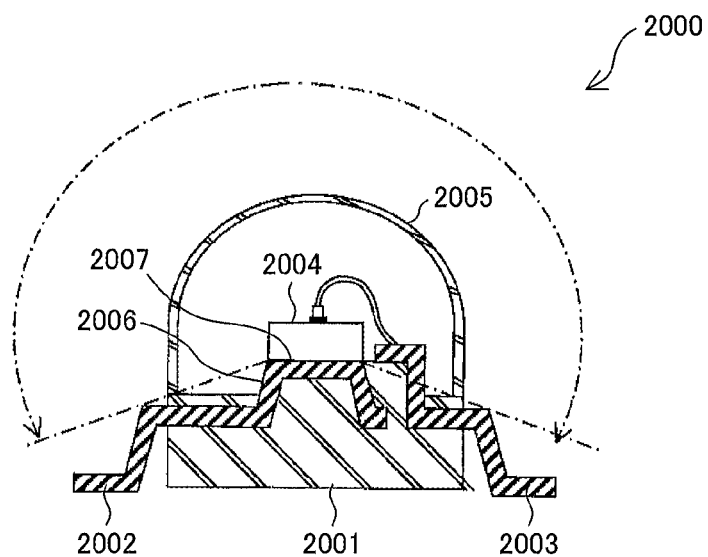
FIG. 20 is a cross sectional view showing a configuration of a conventional illumination device.
Figure 21:
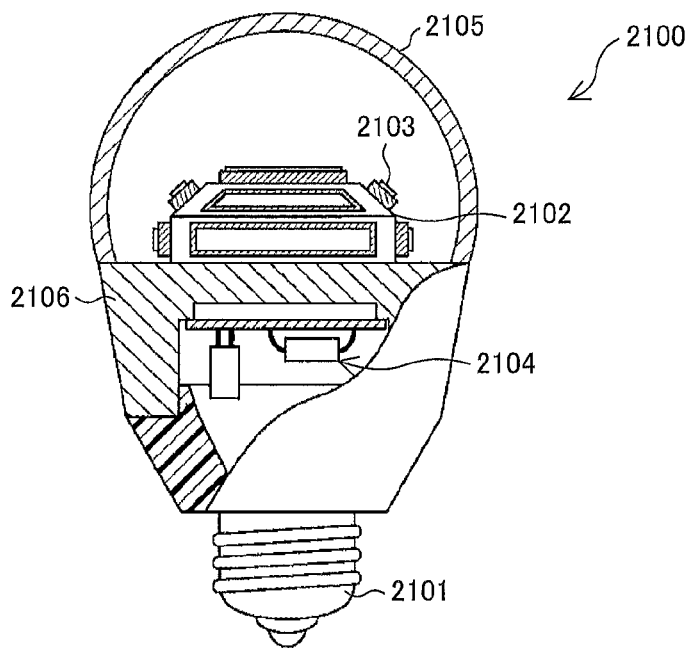
FIG. 21 is a cross sectional view showing a configuration of another conventional illumination device.

FIG. 19 is a view showing a result of measurement of the light distribution characteristics of the LED bulb 700. In FIG. 19, a solid line indicates light distribution characteristics (a) of the LED bulb 700 of the present embodiment, and a dashed line indicates light distribution characteristics (b) of a conventional LED bulb. Note that, a perpendicular line to a mounting surface from a globe side is assumed to be 0° (i.e., 180° is in the base-side direction).

A light distribution angle of the conventional LED bulb was 120°. According to the light distribution characteristics (b), it can be observed that the light distribution angle was not to distribute the light in the base-side direction. On the other hand, a light distribution angle of the LED bulb 700 was 300°. Furthermore, according to the light distribution characteristics (a), it can be observed that the light distribution angle distributes in the base-side direction. Accordingly, the results show that the LED bulb 700 of the present embodiment can obtain the light distribution angle equivalent to that of a conventional incandescent lamp.

As described above, the LED bulb 700 includes a double light source constituted by the sub-light sources 10 and 30 and also includes a triple reflector constituted by the first reflecting member 208 and the second reflecting member 211, and the side face 302b of the mounting base 302. This allows the LED bulb 700 to obtain a wider light distribution angle.

Furthermore, in FIG. 18, as indicated by an arrow P, heat from the sub-light source 10 is radiated to the mounting base 302. Whereas, as indicated by an arrow Q, heat from the sub-light source 30 is radiated to the second reflecting member 211. This means that the LED bulb 700 is excellent in heat radiation.

The above descriptions discuss the respective embodiments. Each of the above-described embodiments is not limited to be configured as described above, but also be configured as below.

For example, in a light source device, the number of substrates is not limited to one or two, but can be three or more. Furthermore, the number of LED chips is also not limited to the number shown in drawings.

In other words, an LED bulb can be configured to include a light source device, wherein the light source device includes: a plurality of substrates each being provided with a plurality of LED chips, the plurality of substrates being stacked in a perpendicular direction to a mounting surface; and a first reflecting member being sandwiched between each substrates thus stacked, the first reflecting member being in a truncated cone shape, and at least a side face of the first reflecting member having a light reflecting function, each first reflecting member being provided on each of the plurality of substrates except a topmost substrate among the plurality of substrates, in such a way that the first reflecting member is positioned at a center of that substrate, the side face of the first reflecting member makes an acute exterior angle with that substrate, and the plurality of LED chips on that substrate are provided so as to surround the first reflecting member.

The LED bulb can also be configured such that a light source includes a second reflecting member in a truncated cone shape, at least a side face of the second reflecting member having a light reflecting function, the second reflecting member being provided on the topmost substrate in such a way that the second reflecting member is positioned at a center of the topmost substrate, and the side face of the second reflecting member makes an acute exterior angle with the topmost substrate, and the plurality of light-emitting elements on the topmost substrate are provided so as to surround the second reflecting member With the above arrangement, it is possible to realize an LED bulb, which has light distribution characteristics equivalent to those of a conventional incandescent lamp by solving disadvantages of a light source employing LED chips, which disadvantage regards its light emission restricted due to a directivity of the LED chips.

Furthermore, the light source device is configured to include: a substrate on which the plurality of LED chips are provided; and a reflecting member in a truncated cone shape, at least a side face of the reflecting member having a light reflecting function, the reflecting member being provided on the substrate in such a way that the reflecting member is positioned at a center of the substrate, the side face of the reflecting member makes an acute exterior angle with the substrate, and the plurality of LED chips on that substrate are provided so as to surround the reflecting member.

Alternatively, the light source device is configured to include: a plurality of substrates each being provided with a plurality of LED chips, the plurality of substrates being stacked; and a first reflecting member being sandwiched between each substrates thus stacked, the first reflecting member being in a truncated cone shape, and at least a side face of the first reflecting member having a light reflecting function, each first reflecting member being provided on each of the plurality of substrates except a topmost substrate among the plurality of substrates, in such a way that the first reflecting member is positioned at a center of that substrate, the side face of the first reflecting member makes an acute exterior angle with that substrate, and the plurality of LED chips on that substrate are provided so as to surround the first reflecting member.

According to each of the configurations, light emitted from the LED chips can be reflected in a direction of 90° or more with respect to a perpendicular line by the reflecting member or the first reflecting member, assuming that the perpendicular line perpendicular to the substrate on which the LED chips are provided is 0°. As a result, a luminous intensity toward a rear side of the substrate, on a top surface of which light-emitting elements are provided can be attained without the need of a complex structure. Therefore, it is possible to realize a light source device capable of obtaining light emitting capacity equivalent to a light source of an incandescent lamp. This makes it possible for the light source device to contribute to improvement of the light distribution characteristics when the light source device is provided in an illumination device.

In the embodiments, LED bulbs are discussed.

Note however, the LED bulbs can be realized in various shapes. Specifically, each of the globes 104, 304, 704 is not limited to be in a hemispherical shape or a spherical shell shape, but can be in various shapes such as a cuboid or a cylinder. The housing 101 and the base 103 can also be variously shaped. Furthermore, the mounting plate 102 can be shaped based on shapes of the globe and the housing. Provided that the upper surface 302a and the side face 302b of the mounting base 302 are provided as described earlier, other parts (for example, the depressed section 302c) of the mounting base 302 can be shaped based on the shapes of the globe and the housing. Accordingly, it is possible to realize not only bulb-shaped illumination devices but also various illumination devices by selecting shapes of the illumination device based on a situation in which the illumination device is to be used.

The present invention is not limited to the description of the embodiments above, but may be altered by a skilled person within the scope of the claims. An embodiment based on a proper combination of technical means disclosed in different embodiments is encompassed in the technical scope of the present invention.

(Main Points of Invention)

As described earlier, it is preferable for an illumination device in accordance with embodiments of the present invention to be configured such that: the mounting base has a truncated cone shape; the light source device is provided on an upper surface of the mounting base; the globe is provided so as to cover the light source device, the upper surface of the mounting base and at least a part of a side face of the mounting base; and the side face of the mounting base has a light reflecting function.

According to the above configuration, it is possible to emit light outside the illumination device in such a way that the mounting base does not block a luminous intensity which has been obtained in a mounting base side by the light source device. Therefore, the illumination device can be configured to utilize a wide light distribution angle made by the light source device as much as possible.

It is preferable for the illumination device in accordance with the embodiments of the present invention to be configured such that the side face of the mounting base inclines at an exterior angle of 60° to 90° with the upper surface of the mounting base.

It is preferable for the illumination device in accordance with the embodiments of the present invention to be configured such that: the plurality of first light-emitting elements are sealed with a transparent resin; and the globe contains a fluorescent material. This makes it possible to easily change and adjust a color of emission light with the globe which is easily arranged to be detachable.

Alternatively, it is preferable for the illumination device in accordance with the embodiments of the present invention to be configured such that: the plurality of first light-emitting elements are sealed with a fluorescent material containing resin which contains a fluorescent material; and the globe is made of a transparent resin. This makes it possible for the illumination device to easily emit light in a desired color.

It is preferable that the illumination device in accordance with the embodiments of the present invention includes a lens section protruding outwardly and being formed on a surface of the first reflecting member, which surface is opposite to another surface of the first reflecting member, the another surface facing the first substrate. With this configuration, a part of light reflected at an inner side of the globe is reflected again by the lens section towards a globe side. Therefore, the first reflecting member can increase a light component towards the globe side.

It is preferable for the illumination device in accordance with the embodiments of the present invention to be configured such that the light source device further includes: a second substrate having a third surface and a fourth surface on an opposite side of the third surface, the second substrate being provided on a surface of the first reflecting member, which surface is opposite to another surface of the first reflecting member, the another surface facing the first substrate, and the fourth surface being provided so as to face the surface of the first reflecting member, which surface is opposite to the another surface facing the first substrate; and a plurality of second light-emitting elements provided on the third surface. With this configuration, the plurality of second light-emitting elements provided on the second substrate can increase a light component towards the globe side from the third surface of the second substrate.

It is preferable for the illumination device in accordance with the embodiments of the present invention to be configured such that: the plurality of first light-emitting elements and the plurality of second light-emitting elements are respectively sealed with a transparent resin; and the globe contains a fluorescent material. This makes it possible to easily change and adjust a color of emission light with the globe which is easily arranged to be detachable.

Alternatively, it is preferable for the illumination device in accordance with the embodiments of the present invention to be configured such that: the plurality of first light-emitting elements and the plurality of second light-emitting elements are respectively sealed with a fluorescent material containing resin which contain a fluorescent material; and the globe is made of a transparent resin. This makes it possible, in the illumination device, to easily obtain emission light in a desired color.

It is preferable for the illumination device in accordance with the embodiments of the present invention to be configured such that the light source device further includes, at a center of the third surface, a second reflecting member in a truncated cone shape, the second reflecting member being provided so that a side face of the second reflecting member makes an acute exterior angle with the third surface, at least the side face of the second reflecting member has a light reflecting function; and the plurality of second light-emitting elements are provided so as to surround the second reflecting member.

According to the above configuration, light emitted from the second light-emitting elements can be reflected in a direction of 90° or more by the second reflecting member provided on the surface on which the second light-emitting elements are provided. As a result, the light component on the mounting base side can be further increased.

It is preferable for the illumination device in accordance with the embodiments of the present invention to be configured such that the light source device further includes: on the third surface, a sealing resin which is provided so that all the second light-emitting elements are embedded in the sealing resin, and a top surface of which is in a funnel shape depressing at a center of the top surface; and at the top surface, a metal layer having a light reflecting function.

According to the above configuration, the light emitted from the second light-emitting elements is emitted in a lateral direction and in the mounting base side on being reflected by the metal layer. This increases the light component of the illumination device in the lateral direction and the mounting base side. As a result, the light component on the mounting base side can be further increased.

It is preferable for the illumination device in accordance with the embodiments of the present invention to be configured such that the plurality of first light-emitting elements are circularly positioned, at regular intervals, so as to surround the first reflecting member. This makes it possible to obtain uniform emission light.

It is preferable for the illumination device in accordance with the embodiments of the present invention to be configured such that: the plurality of first light-emitting elements are circularly positioned, at regular intervals, so as to surround the first reflecting member; and the plurality of second light-emitting elements are circularly positioned, at regular intervals, so as to surround the second reflecting member. This makes it possible to obtain uniform emission light.

It is preferable that the illumination device in accordance with the embodiments of the present invention includes: a voltage applying terminal for applying a voltage to the plurality of first light-emitting elements; and a voltage applying terminal for applying a voltage to the plurality of second light-emitting elements, the voltage applying terminal for the first light-emitting elements and the voltage applying terminal for the second light-emitting elements being provided independently.

According to the above configuration, it is possible to independently operate the first light-emitting elements and the second light-emitting elements. Therefore, it is possible to (i) increase a variety of how to emit light and (ii) achieve reduction in electric power consumption by selectively switching between lighting of the first light-emitting elements and lighting of the second light-emitting elements.

For example, since the independent operation of the first and second light-emitting elements can be carried out, in a case where it is desired to emit light in spot lighting (to irradiate a spot right under the illumination device), it is appropriate to operate the second light-emitting elements, whereas in a case where is it desired to emit light in a wide distribution, although just under the illumination is dark, it is appropriate to operate only the first light-emitting elements.

It is preferable that the illumination device in accordance with the embodiments of the present invention further includes a sensor for detecting a moving object, the light source device turning on and off the illumination device in accordance with a result of detection of the sensor.

According to the above configuration, it is possible to turn on the light source device when a moving object (for example, a person) is detected by the sensor, whereas it is also possible to turn off the light source device when no moving object is detected by the sensor. Furthermore, in the case where the first and second light-emitting elements can be independently operated, it is possible to operate each of the first and second light-emitting elements on a basis of a result of the detection of the sensor. This makes it possible to achieve reduction in electric power consumption.

It is preferable for the illumination device in accordance with the embodiments of the present invention to be configured such that the sensor is an infrared sensor or a sound sensor.

It is preferable for the illumination device in accordance with the embodiments of the present invention to be configured such that the mounting base further serves as a heat radiator. This makes it possible to appropriately radiate heat caused in the light source device.

It is preferable that the illumination device in accordance with the embodiments of the present invention further includes a circuit substrate on which a drive circuit for driving the light source device is provided, wherein the mounting base has a depressed section on its lower surface, the depressed section accommodating a part of the circuit substrate therein. Making good use of the depressed section on the lower surface of the mounting base as an accommodation space for the circuit substrate can contribute to down-sizing of the illumination device.

It is preferable for the illumination device in accordance with the embodiments of the present invention to be configured such that the globe has a single layer structure formed from a fluorescent material containing resin which contains the fluorescent material.

Alternatively, it is preferable for the illumination device in accordance with the embodiments of the present invention to be configured such that the globe has a multilayer structure in which at least one of layers of the multilayer structure is formed from a fluorescent material containing resin which contains the fluorescent material.

It is preferable for the illumination device in accordance with the embodiments of the present invention to be configured such that the light source device further includes a second reflecting member in a truncated cone shape, at least a side face of the second reflecting member having a light reflecting function, the second reflecting member being provided on the topmost substrate in such a way that the second reflecting member is positioned at a center of the topmost substrate, and the side face of the second reflecting member makes an acute exterior angle with the topmost substrate, and the plurality of light-emitting elements on the topmost substrate are provided so as to surround the second reflecting member.

According to the above configuration, light emitted from light-emitting elements on the topmost substrate can be reflected in a direction of 90° or more by the second reflecting member provided on the surface on which the light-emitting elements are provided. As a result, the light component on the mounting base side can be further increased.

It is preferable for the illumination device in accordance with the embodiments of the present invention to be a bulb illumination device.

It is preferable for the illumination device in accordance with the embodiments of the present invention to be configured such that the plurality of light-emitting elements are circularly positioned, at regular intervals, so as to surround the reflecting member. This makes it possible to obtain uniform emission light.

It is preferable for the illumination device in accordance with the embodiments of the present invention to be configured such that, on each of the plurality of substrates except a topmost substrate among the plurality of substrates, the plurality of light-emitting elements are circularly positioned, at regular intervals, so as to surround the first reflecting member. This makes it possible to obtain uniform emission light.

It is preferable that the illumination device in accordance with the embodiments of the present invention further includes a second reflecting member in a truncated cone shape, at least a side face of the second reflecting member having a light reflecting function, the second reflecting member being provided on the topmost substrate in such a way that the second reflecting member is positioned at a center of the topmost substrate, and the side face of the second reflecting member makes an acute exterior angle with the topmost substrate, and the plurality of light-emitting elements on the topmost substrate are provided so as to surround the second reflecting member.

According to the above configuration, light emitted from light-emitting elements on the topmost substrate can be reflected in a direction of 90° or more by the second reflecting member provided on the surface on which the light-emitting elements are provided. As a result, the light component on a rear side of the substrate, on a top surface of which the light-emitting elements are provided can be further increased.

It is preferable for the illumination device in accordance with the embodiments of the present invention to be configured such that the plurality of light-emitting elements on the topmost substrate are circularly positioned, at regular intervals, so as to surround the second reflecting member. This makes it possible to obtain uniform emission light.

INDUSTRIAL APPLICABILITY

The present invention can be suitably applicable not only to a field related to a light source device employing an LED as a light source and an illumination device equipped with the light source device, but also to a field related to a method for producing the light source device and the illumination device. In particular, the present invention is especially applicable to an LED illumination light source and an LED illumination device each of which is desired to be equipped with light distribution characteristics equivalent to that of an incandescent lamp.

REFERENCE SIGNS LIST

10 Sub-light source
11 Substrate (first substrate)
15 LED chip (light-emitting element, first light-emitting element)
19 Sealing resin
30 Sub-light source
31 Substrate (second substrate)
35 LED chip (light-emitting element, second light-emitting element)
38 Sealing resin
50 Sub-light source
51 Substrate (second substrate)
55 LED chip (light-emitting element, second light-emitting element)
58 Sealing resin
59 Metal Layer
100, 200, 300, 400, 450, 500, 600, 700, 800 LED bulb (illumination device)
101 Housing
102 Mounting plate (mounting base)
103 Base
104, 304, 704 Globe
105, 205, 405, 605, 805 Light source device
108 Reflecting member (first reflecting member)
108a Lens section
208 First reflecting member
211 Second reflecting member
302 Mounting base
302a Upper surface (mounting surface)
302b Side face
302c Depressed section
451 Circuit substrate
530 Sensor
607 First lead wire (voltage applying terminal)
608 Second lead wire (voltage applying terminal)
609 Reflecting member (first reflecting member)
610 Reflector

The invention claimed is:
1. A light source device comprising:
a substrate comprising a first surface and a second surface on an opposite side of the first surface;
a through hole penetrating the substrate;
a plurality of light-emitting elements provided, on the first surface, so as to surround the through hole;
a wiring pattern provided on the first surface, the wiring pattern including an anode land and a cathode land each of which is capable of being connected to outside;
a first resin dam and a second resin dam provided respectively on an inner side and an outer side of a region in which the light-emitting elements are provided; and
a sealing resin sealing the plurality of light-emitting elements and filling a part surrounded by the first resin dam,
the first resin dam being provided in a circular ring shape, and
the through hole being provided at a center of the circular ring shape of the first resin dam.
2. The light source device as set forth in claim 1, wherein the substrate has a circular ring shape.
3. The light source device as set forth in claim 1, wherein the anode land and the cathode land are provided between the first resin dam provided and the through hole.
4. The light source device as set forth in claim 3, wherein the anode land and the cathode land are provided opposite each other with the through hole therebetween.
5. The light source device as set forth in claim 1, wherein the first resin dam and the second resin dam comprise an insulating resin material in white or milky white color.
6. The light source device as set forth in claim 1, where in the second resin dam is provided in a circular ring shape.
7. The light source device as set forth in claim 1, where in the Sealing resin comprises a fluorescent material.
8. The light source device as set forth in claim 1, wherein the plurality of light-emitting elements are circularly positioned.
9. The light source device as set forth in claim 8, wherein the plurality of light-emitting elements are arranged in a plurality of circular lines.
10. The light source device as set forth in claim 1, wherein the light-emitting elements are electrically connected to each other via wires.
11. The light source device as set forth in claim 1, wherein the light-emitting elements and the wiring pattern are electrically connected via wires.
12. The light source device as set forth in claim 1, further comprising a printed resistor or a protecting element formed to be connected in parallel with the light-emitting elements.
13. A lighting device comprising a light source device as set forth in claim 1.
14. The light source device as set forth in claim 1, further comprising a reflecting member positioned to face the through-hole.

* * * * *